United States Patent [19]

Pratt et al.

[11] 4,330,833

[45] May 18, 1982

[54] METHOD AND APPARATUS FOR IMPROVED DIGITAL IMAGE PROCESSING

[75] Inventors: William K. Pratt, Santa Monica, Calif.; Jean-Francois Abramatic, Versailles; Olivier Faugeras, Saint Nom La Breteche, both of France

[73] Assignee: Vicom Systems, Inc., San Jose, Calif.

[21] Appl. No.: 910,089

[22] Filed: May 26, 1978
(Under 37 CFR 1.47)

[51] Int. Cl.³ .......................... G06F 15/31; H04N 5/21
[52] U.S. Cl. .................................. 364/515; 358/166; 358/167; 364/724; 364/728
[58] Field of Search ....................... 364/515, 724, 728; 340/146.3 MA; 358/160, 166, 167, 903

[56] References Cited

U.S. PATENT DOCUMENTS

| | | | |
|---|---|---|---|
| 3,997,774 | 12/1976 | Schlaepfer | 364/515 |
| 4,058,836 | 11/1977 | Drewery et al. | 358/167 |
| 4,064,530 | 12/1977 | Kaiser et al. | 364/724 X |
| 4,127,874 | 11/1978 | Iwasawa et al. | 358/167 |
| 4,134,134 | 1/1979 | Lux | 364/515 X |

*Primary Examiner*—Jerry Smith
*Attorney, Agent, or Firm*—Lyon & Lyon

[57] ABSTRACT

An improved method and apparatus for digital image processing is disclosed which permits greater efficiency in implementation of digital filtering techniques. In one implementation specially selected small generating kernels, or masks, are sequentially convolved with a data array of pixels representative of a particular image for more efficient restoration, enhancement or other conventional digital image processing techniques. The small generating kernels may be varied for each sequential convolution. In some implementations the output of each sequential convolution may be weighted in accordance with the filtering desired. Means for implementing the method are also disclosed.

13 Claims, 2 Drawing Figures

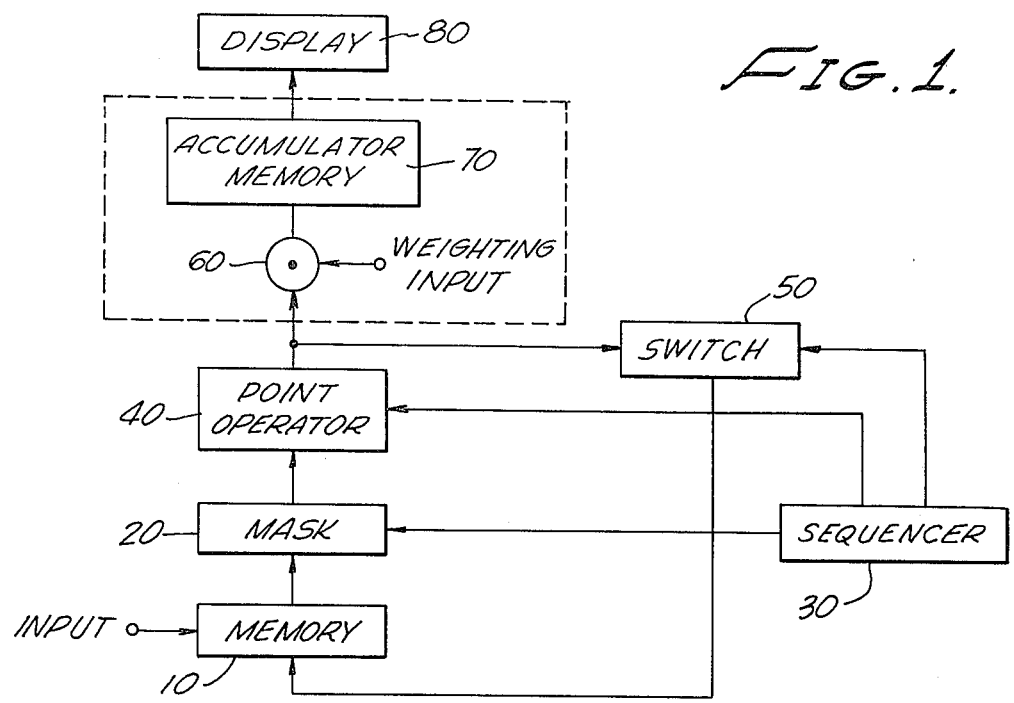

METHOD AND APPARATUS FOR IMPROVED DIGITAL IMAGE PROCESSING

FIELD OF THE INVENTION

The present invention relates generally to digital image processing and more particularly to digital filtering techniques involving convolution with two-dimensional filters having finite impulse response.

BACKGROUND OF THE INVENTION

Digital image processing refers generally to methods of performing various tasks upon images stored in digital form. A familiar example of digital image processing is the restoration improvement of photographs or other images taken by satellites or astronauts in outer space and then transmitted to Earth. In simple terms, digital images may be thought of as an array of dots (commonly referred to as "pixels"), with each pixel being assigned a value in accordance with its brightness or luminance. For color images, one pixel may be assigned a value for each primary color of the system. The pixel array may be viewed mathematically as a matrix of data for purposes of digital image processing.

As noted above, digital image processing encompasses restoration, or enhancement either by "smoothing" or "sharpening," and numerous other techniques well known in the art. Each of these techniques is accomplished by some kind of linear convolutional processing or filtering, whether it be convolution, recursive filtering, or Fourier transform filtering. These techniques generally employ two-dimensional filters having finite impulse response (FIR).

Unfortunately, while applications of two-dimensional filtering are becoming of increasing importance, as, for example, in geophysical exploration, earthquake/nuclear test detection, sonar, radar and radio astronomy, in addition to picture encoding, filtering of large size data sets requires a great amount of computation using conventional filtering methods. An example of the computational problems encountered with conventional convolution or filtering techniques can be seen from *Digital Image Processing*, by William K. Pratt, Wiley-Interscience, 1978, Library of Congress catalog no. TA 1632.P7 1978, particularly chapters 1 and 9. In discrete convolution a filter is defined by an impulse response, or operator, which generally comprises a plurality of values, or parameters, arranged in matrix form. The operator matrix may be viewed as a mask which is then scanned over, or convolved with a generally larger pixel matrix to achieve the desired processing. Typical dimensions of the impulse response array are on the order of $15 \times 15$ or $21 \times 21$, but may be as large as $61 \times 61$. The pixel matrix typically has dimensions on the order of $512 \times 512$. Thus a single discrete convolution involves approximately $15 \cdot 15 \cdot 512 \cdot 512 = 58,982,400$ computations. It can thus be seen that a more manageable method of digitally processing an image has been required.

There have been some background investigations into more efficient convolution processing methods. In an article by J. H. MacClellan entitled "The Design of Two-Dimensional Digital Filters by Transformations", Proc. 7th Annual Princeton Conf. Information Sciences and Systems, pp. 247-251 (1973), it was shown that a one-dimensional zero-phase FIR filter could be mapped into a two-dimensional zero-phase FIR filter by substitution of variables. In a subsequent article by Mecklenbrauker and Mersereau entitled "MacClellan Transformations for Two-Dimensional Digital Filtering: I-Design, II-Implementation," IEEE Transactions on Circuits and Systems—Vol. CAS-23, No. 7, pp. 405–422 (July 1976), the MacClellan model was generalized and methods were developed to implement such filters by ordinary sequential filtering techniques. A third and fourth section of the article by Mecklenbrauker and Mersereau provided algorithms for determining parameters, and also examples.

SUMMARY OF THE INVENTION

The present invention provides a processing method which substantially reduces the number of computations required for discrete convolution while at the same time providing a good approximation of the results reached by conventional convolution. The method provides an approximation of the transfer function of a two-dimensional FIR filter implemented by direct or conventional convolution. In the method of the present invention, a new operator matrix having dimensions smaller than the conventional operator is defined, and may be termed a "small generating kernel." The small generating kernel (SGK) may typically have dimensions on the order of $3 \times 3$ elements.

The SGK is then scanned over the data matrix in the manner of conventional convolution, except that the SGK is re-scanned over the previous output data matrix a plurality of times, and different element values may be employed for the operator mask during each scan. The repeated scans are then weighted and/or summed in accordance with the desired processing effect, yielding a close approximation to the results obtained with direct convolution. In this manner the data are sequentially convolved with a plurality of masks defined by the small generating kernels until the dimensions of the sequential convolutions equal those which would result from a direct convolution. The selection of element values of the SGK operator may generally be determined by conventional error minimization techniques, such as the mean square error or Chebyshev error methods.

The present invention also includes apparatus employing the above-described techniques to provide a digitally processed display. In one embodiment, the input data is provided to a data storage device, and is sequentially scanned or convolved with a mask. The output of the mask is then supplied to a point operator circuit, which may for example be configured to perform a linear operation on the mask output. The output of the point operator circuit may then be supplied to a switching circuit.

By actuating the switching circuit, the information which forms the output of the point operator circuit is supplied to the data storage device and replaces the information originally contained therein. The new data is now ready for a second scan through the mask. However, the elements of the mask may now be varied in accordance with the desired filtering effects. The information which forms the output of the mask is then operated upon in the manner described above, and the iterations are continued until the sequential convolution attains the dimensions of the conventional convolution.

It is one object of the present invention to provide an improved method of digitally processing data.

It is another object of the present invention to provide a more efficient method of processing digital images.

It is another object of the present invention to provide an improved method of processing digital images through two-dimensional linear filtering.

It is a further object of the present invention to provide a technique for processing digital images involving synthesis of a filter having a finite impulse response which employs a small generating kernel technique to approximate conventional convolution.

Other and further objects of the present invention will be apparent from the following detailed description of the invention, taken in conjunction with the attached drawings which are described briefly below.

BRIEF DESCRIPTION OF THE DRAWINGS

FIG. 1 shows in schematic block diagram form a system for processing monochromatic digital images according to the present invention.

FIG. 2 shows in schematic block diagram form a system for processing polychromatic digital images according to the present invention.

DETAILED DESCRIPTION OF THE INVENTION

Referring now to FIG. 1, there is illustrated therein, in schematic block diagram form, a system for processing monochromatic digital images in accordance with the present invention. Data is provided to the system via an input terminal to a memory device 10, where it is stored for subsequent operation. The input data is typically an array representative of the brightness of the pixels which comprise a given image. Conventionally each pixel is scaled by brightness on a 256-Bit ($2^8$) grey scale.

The memory 10 may be any of a number of conventional storage devices suitable for storing large data arrays. For conventional digital images, the dimensions of the array will typically be on the order of $512 \times 512$ pixels. Thus, for example, a commercially available solid state memory of suitable size may be used.

Once the input data has been entered into the memory 10, the data array is scanned by a mask circuit 20. The mask circuit 20 is a two-dimensional digital operator having a finite impulse response, and may mathematically be viewed as a matrix array, the numerical values of which are supplied by a sequencing device 30. The scanning process can then be thought of as a convolution of the mask array with the data array. Thus it follows that the mask circuit 20 comprises a network of multipliers and adders, with the multipliers producing the appropriate products of elements from the mask array and data array, which products are then added. For example, if the desire filter is represented by a $3 \times 3$ mask array, nine multipliers and nine adders are required for the mask circuit 20.

The sequencer 30 may be any of a number of conventional devices for supplying data to a particular unit at a particular time. For example, the sequencer 30 may comprise a series of registers and counters in combination with memory, or may comprise a microprocessor. The sequencer 30 thus stores the values of the mask array and provides them at the appropriate times to the mask circuit 20 as needed, in addition to other functions described hereinafter. The values supplied by the sequencer 30 are determined by any one of several conventional methods described hereinafter.

After the scan of the data array by the mask circuit 20 has been completed by convolving the mask array with the data array, the output is passed through a point operator circuit 40. The point operator circuit 40 typically modifies an input in accordance with a predetermined criteria which may be either linear or nonlinear. For example, the point operator circuit 40 may comprise a look-up table which provides a predetermined output for each input. This may be conventionally implemented by the user of an input addressable ROM (read only memory) or other suitable device. The point operator circuit 40 is likewise typically controlled by the sequencer 30.

The output of the point operator circuit 40 is then provided to a switching circuit 50, which is controlled by the sequencer 30. The output of the switching circuit 50 is connected to the input of the memory 10. By actuating the switch 50, the data which has been modified by the mask circuit 20 and point operator circuit 40 is entered into the memory 10 and replaces the originally entered data.

It is at this point that the distinctions between the present invention and the conventional convolution filtering techniques known in the art emerge. Conventionally, the output data array from the point operator circuit 40 is displayed as a final product; i.e., a completed convolution and a completely processed image. However, in the present invention the output of the point operator circuit represents only a first iteration of processing. For the present invention, the above process is repeated a plurality of times, the exact number of iterations being determined by the dimensions of the matrix which defines the conventional convolution operator and therefore also defines an ideal, or prototype, filter response.

As noted previously, a conventional convolution operator typically has dimensions on the order of $15 \times 15$ or $21 \times 21$ and may have dimensions on the order of $61 \times 61$. Because of the substantially smaller dimensions of the mask array of the present invention, and also because the dimensions of convolved arrays build at a rate of $(L-1)$ for each iteration after the first for an $L \times L$ array, the iterations required to approximate a $15 \times 15$ conventional operator (seven iterations) can be completed far more efficiently than a single convolution of the conventional convolution operator. This can be seen from a comparison of the number of computations required for a conventional convolution of a $15 \times 15$ operator and an $M \times N$ data array, with the number of computations required in the method of the present invention wherein a $3 \times 3$ mask array, which may also be referred to as a small generating kernel (or SGK) is used. For a conventional convolution, the number of computations required is 15.15.M.N, or 225.M.N. In contrast, the number of computations required with the present invention is (3.3.M.N)7 or 63.M.N. The magnitude of advantage available with the present invention becomes more apparent when it is seen that the number of computations required for a conventional convolution increases quadratically with increases in the size of the operator matrix, whereas the compuations required under the system of the present invention increases only linearly, as a function of the required number of iterations.

From the foregoing it can be appreciated that the present method provides a substantially more efficient method of digitally filtering images than conventional convolution, once the values of the elements in the mask array are selected. As will be discussed below, the element values of the mask array may be assigned through any of a number of conventional error minimization techniques. Further, the assigned values may be altered with each iteration or, depending upon which of the below-described implementations is used, the results of each iteration may be weighted according to a predetermined weighting input through the use of a weighting multiplier 60, and the results of the iterations may be accumulated in an accumulator memory 70. The processed image is then displayed by a conventional display means 80.

A detailed description of two embodiments of FIG. 1 is given below.

In the first embodiment, input F(j,k) is convolved with $K_1(j,k)$, and its output is convolved with $K_2(j,k)$, and so on until the output of the next to last convolution is convolved with $K_Q(j,k)$. At each stage of the convolution, the output is multiplied by a weighting factor $\lambda_q$ and added to the weighted outputs of previous stages. The final output, after Q stages of convolution, is the accumulated weighted output.

Applying the above process to the description of FIG. 1, it can be seen that the input F(j,k) is provided to the memory 10, and is then scanned or convolved with a first mask comprising a SGK operator $K_1(j,k)$. The output is then provided back to the memory 10, and also to the weighting circuit ($\lambda_1$). The output of the weighting circuit is then stored in the accumulator memory 70 and displayed (if desired) in the display 80. On the second iteration, the revised data is scanned by the SGK operator $K_2(j,k)$, and again stored in memory, weighted (by $\lambda_2$), accumulated, weighted, and displayed. The iterations continue in the manner described in connection with FIG. 1 until the dimensions of the sequential convolution equal those of the direct or conventional implementation.

From the mathematical description given above, it can be seen that the values of the SGK operators may be varied for each iteration, and likewise the $\lambda$ weighting inputs may be varied for each iteration. It will be apparent that modifications can readily be made to the optimization process which will permit either the weighting inputs or the SGK operators to remain constant.

Alternatively the weighting inputs $\lambda$ could be disposed of entirely as described below in connection with a second implementation. In the second implementation, input F(j,k) is convolved with $K_1(j,k)$, and its output is convolved with $K_2(j,k)$, and so on until the output of the next to last convolution is convolved with $K_Q(j,k)$. The final output after Q stages of convolution is the direct output from convolution array $K_Q(j,k)$. Applying the above to FIG. 1, each convolution step represents one iteration of the input, mask, point operator, and switch as described with respect to FIG. 1. However, the weighting multiplier 60, the weighting inputs, and the accumulator memory 70 are eliminated, with the output of the point operator circuit 40 being connected directly to the display 80. Thus the output of the point operator circuit may be displayed during each sequential convolution. Also, since substantial circuitry is eliminated, economic advantages attach to this method of implementation.

From the above, it can be seen that the method of the present invention depends, at least in part, upon the accuracy with which the set of mask arrays approximates the ideal filter impulse response, as represented by the conventional convolution operator or its transform function. One of the conventional techniques for minimizing the error between an approximation and an ideal is the technique of mean square error. Applying this technique to the choices of values for the SGK operator, let:

F(j,k) = input array (image) (J×K);

H(j,k) = ideal impulse response array for a prototype two-dimensional filter (2M+1)×(2M+1);

$K_q(j,k)$ = SGK impulse response array of q-th stage to the method of the present invention (2L+1)×(2L+1);

$A_q(j,k)$ = output of the q-th convolution stage of the present invention where $A_0(j,k)$ = F(j,k)

G(j,k) = ideal output response; and

Ĝ(j,k) = approximate output response according to the method of the present invention.

Then the conventional output response is $$G(j,k) = [H(j,k)] \circledast [F(j,k)] \qquad (1)$$

where the convolution operation is defined as $$G(j,k) = \sum_{m=-M}^{M} \sum_{m=-M}^{M} H(m,n)F(j-m, k-n) \qquad (2)$$

The output response for the first embodiment of this invention is $$\hat{G}(j,k) = \sum_{q=1}^{Q} \lambda_q A_q(j,k) \qquad (3a)$$

or equivalently $$\hat{G}(j,k) = \sum_{q=1}^{Q} \lambda_q [K_1(j,k) \circledast K_2(j,k) \circledast \ldots \circledast K_q(j,k)] \circledast F(j,k) \qquad (3b)$$

The output response for the second embodiment of this invention is $$\hat{G}(j,k) = A_Q(j,k) \qquad (4a)$$

or equivalently $$\hat{G}(j,k) = [K_1(j,k) \circledast K_2(j,k) \circledast \ldots \circledast K_Q(j,k)] \circledast F(j,k) \qquad (4b)$$

By using the technique of mean square error, the error is:

$$\epsilon = \sum_{j=1}^{J} \sum_{k=1}^{K} [G(j,k) - \hat{G}(j,k)]^2 \qquad (5)$$

However, because F(j,k) appears in the space domain expansions for both G(j,k) and Ĝ(j,k) above, the error for the first embodiment is $$\epsilon = C \sum_{j=-M}^{M} \sum_{k=-M}^{M} \left\{ H(j,k) - \sum_{q=1}^{Q} \lambda_q [K_1(j,k) \circledast \ldots \circledast K_q(j,k)] \right\}^2 \qquad (6)$$

and for the second embodiment the error is $$\epsilon = C \sum_{j=-M}^{M} \sum_{k=-M}^{M} \{H(j,k) - [K_1(j,k) \circledast K_2(j,k) \circledast \ldots \circledast K_q(j,k)]\}^2 \quad (7)$$

where C is a proportionality constant.

The optimization method will now be described for the first embodiment of the invention in which each of the small generating kernels $K_q(j,k) \equiv K(j,k)$ are identical. The optimization method generalizes directly for the case of different small generating kernels and also for the second embodiment.

For purposes of derivation, the desired impulse response $H(j,k)$ can be expressed in the Z-transform domain as $$H(z_1,z_2) = \sum_{p=-M}^{M} \sum_{q=-M}^{M} H(p,q) z_1^{-p} z_2^{-q} \quad (8)$$

The Z-transform of the equivalent impulse response array is $$\beta(z_1,z_2) = \sum_{q=1}^{Q} \lambda_q \kappa^q(z_1,z_2) \quad (9)$$

where $$\kappa(z_1,z_2) = \sum_{i=-L}^{L} \sum_{j=-L}^{L} K(i,j) z_1^{-i} z_2^{-j} \quad (10)$$

The mean square error may then be expressed in the Z-transform domain as $$\epsilon = C \phi_{\Gamma_1} \phi_{\Gamma_2} |H(z_1,z_2) - \beta(z_1,z_2)|^2 \frac{dz_1}{2\pi i z_1} \frac{dz_2}{2\pi i z_2} \quad (11)$$

where $\Gamma_1$ and $\Gamma_2$ are unit circles of the $z_1$ and $z_2$ complex planes. The problem may then be split into two parts, first a nonlinear problem in $K(i,j)$ where $-L \leq i \leq +L, -L \leq j \leq +L$; and second, a linear problem in $\lambda_q$ where $q=1, \ldots, Q$.

Choosing $N^2$ samples of $H(z_1,z_2)$, $K^q(z_1,z_2)$, $\beta(z_1,z_2)$ on $\Gamma_1 \times \Gamma_2$ yields the $N \times N$ arrays $\tilde{H}(m,n)$, $\tilde{K}_q(m,n)$, $\tilde{\beta}(m,n)$, respectively where the tilde overbar indicates the discretization process. The optimization problem then reduces to finding $\lambda_q$ and $K(i,j)$ such that $$\epsilon = C \sum_{m=1}^{N} \sum_{n=1}^{N} |\tilde{H}(m,n) - \tilde{\beta}(m,n)|^2 \quad (12)$$

is a minimum. By stacking the columns of $\tilde{H}(m,n)$ and $\tilde{K}^q(m,n)$ into the vectors h and $k^q$, respectively, and defining P as a $N^2 \times Q$ matrix $$P = [\underline{k}^1 \vdots \underline{k}^2 \vdots \ldots \vdots \underline{k}^Q] \quad (13)$$

the criterion becomes $$\epsilon = C(P^*\lambda - h^*)^T(P\lambda - h) \quad (14)$$

where the underbar denotes vector and matrix symbols, the asterisk denotes the complex conjugate relation, and $\lambda$ is the vector constructed with $\{\lambda_q, q=1, \ldots, Q\}$.

One can easily see that for each P matrix, the optimum value of $\lambda$ is given by $$\lambda = (P^{T*}P + P^T P^*)^{-1}(P^T h^* + P^{T*} h) \quad (15)$$

where the superscript $(-1)$ denotes a matrix inverse and the superscript (T) denotes a matrix transpose. The derivatives of the criterion with respect to $\tilde{K}(m,n)$ are given by $$E(m,n) = \frac{d\epsilon}{d\tilde{\kappa}(m,n)} = 4R_e\{D^*(m,n)[\tilde{H}(m,n) - \tilde{\beta}(m,n)]\} \quad (16)$$

where $R_e\{\cdot\}$ denote the real part of the function and $$D(m,n) = \sum_{q=1}^{Q} q \lambda_q \tilde{\kappa}^{q-1}(m,n) \quad (17)$$

The derivative $d\epsilon/dK(j,k)$ is then obtained by the inverse discrete Fourier transform of $E(m,n)$. Thus we have derived an analytic expression for the gradient which can be easily computed and makes the use of the descent gradient type algorithm extremely appealing.

Although the computations required for calculating the gradient necessary for optimization of the element values of the mask array may be calculated by hand, the more expedient alternative is to perform these calculations by computer. Thus, a computer program suitable for performing such calculations is attached hereto as Appendix A. Alternately, the results of the approach shown above may be achieved using the Chebyshev method. It is believed that those skilled in the art will have no difficulty in making the modifications necessary to implement the Chebyshev method, given the teachings herein.

As an example of the optimization, the following are the optimum values of a $3 \times 3$ small generating kernel and the 12 weighting values for approximation of a $27 \times 27$ conventional convolution operator. The mean square error is approximately 4.7 percent.

$$K = \begin{bmatrix} 0.41943 & 0.23008 & 0.41943 \\ 0.23008 & -0.29080 & 0.23008 \\ 0.41943 & 0.23008 & 0.41943 \end{bmatrix}$$

| q | $\lambda_q$ |
|---|---|
| 1 | $-0.14736 \times 10^{-1}$ |
| 2 | $-0.16344 \times 10^{-2}$ |
| 3 | $+0.12762 \times 10^{0}$ |
| 4 | $+0.71912 \times 10^{-1}$ |
| 5 | $-0.23332 \times 10^{0}$ |
| 6 | $-0.16180 \times 10^{0}$ |
| 7 | $+0.14047 \times 10^{0}$ |
| 8 | $-0.10957 \times 10^{-0}$ |
| 9 | $-0.29152 \times 10^{-1}$ |
| 10 | $-0.26333 \times 10^{-1}$ |
| 11 | $+0.19164 \times 10^{-2}$ |
| 12 | $+0.21075 \times 10^{-2}$ |

Referring now to FIG. 2, there is illustrated therein in schematic block diagram form a system for digitally processing multiple band images, such as color pictures. As will be apparent from a comparison with FIG. 1, FIG. 2 generally comprises three separate channels each of which is similar to the monochromatic single channel illustrated in FIG. 1. For conventional color images, the channels will represent blue, red, and green bands. However, other multiple band systems may employ different constituent bands. Further, more than three bands may be employed. It is believed apparent to those skilled in the art that the system of the present invention may be expanded to include as many bands as are required for a particular technique.

In the system of FIG. 2, input data is supplied to each of the three memory devices 100a, 110b, 110c. The input data is generally different for each band. The input data arrays are then sequentially scanned by their respective mask circuits 120a, 120b, 120c. The elements of the mask array are determined in the manner described above for FIG. 1. It should be noted that the SGK operator may vary for each band, as well as varying for each sequential convolution, since the desired filtering may require emphasis or deemphasis of a particular band. As with FIG. 1, the elements of the mask arrays are supplied to the respective mask circuits 120a-c by a sequencer 150 through conrols A, C and E, respectively.

The outputs of the mask circuits 120a, 120b, 120c are then passed through respective point operator circuits 130a, 130b, 130c as described in connection with FIG. 1.

Again, the point operator circuits 130a-c are controlled by the sequencer 150 through buses B, D and F, respectively. The outputs of the point operator circuits 130a-c are then supplied to a display means 160, and are also fed back to their respective memories 110a-c through a switching circuit 140. As with the system of FIG. 1, the switching circuit 140 is controlled by the sequencer 150. As with the system of FIG. 1, the input data is sequentially scanned by the mask circuits until the dimensions of the output have been built from those of the SGK operators to those of the direct implementation operator, as discussed in detail with FIG. 1.

Having fully described one embodiment of the invention, it is to be understood that numerous variations and equivalents which do not depart from the present invention will be apparent to those skilled in the art based on the teachings herein. Therefore, it is not intended that the scope of the invention be limited to the details disclosed herein, but rather that the invention shall include the variation and equivalents which flow therefrom. While square small generating kernels have been disclosed herein, rectangular or other dimensioned small generating kernels may equally well be used.

```
      DIMENSION IFMT(4),NTF(14),FILF(2),FILR(2)
      EXTERNAL TSTMEM,RIFINT,RIFNF,RIFFPR,RIFLEC
      CALL INIVOL
      CALL OUTSTR(0,'LA REPONSE A IDENTIFIER DOIT ETRE$')
      CALL OUTSTR(0,'     CARREE$')
      CALL OUTSTR(0,'     FLOTTANTE$')
2000  CALL FICENT('REPONSE A IDENTIFIER$',NFG,SFGR,IFMT)
      IF(IFMT(1).NE.IFMT(2))GO TO 1000
      IF(IFMT(4).NE.1)GO TO 1001
6     IZP=IASK(0,'FILTRE ZERO-PHASE ?$')
      IF(IZP.EQ.0)GO TO 5
      IQS=IASK(0,'SYMETRIE QUADRILATERE ?$')
      SFGI=0.
      GO TO 1
5     CALL FICSOR('PARTIE IMAGINAIRE$',NFG,SFGI,IFMT)
1     NS2=IFMT(1)/2+1
      NTF(1)=IFMT(1)*NS2
      NTF(2)=NTF(1)
      NTF(3)=NTF(1)
      NTF(4)=2*IFMT(1)
      NTF(5)=NTF(4)
      CALL EXEC(IER,5,NTF,0,0,RIFINT,NFG,SFGR,SFGI,IFMT,XNMGG)
      IPDEB=INTGET(0,'TAILLE F MINIMUM IMPAIRE ?$')
      IPFIN=INTGET(0,'TAILLE F MAXIMUM ?$')
      CALL EXEC(IER,0,0,1,1,TSTMEM,IFMT(1),IPFIN,NQMX)
      IQDEB=INTGET(0,'Q MINIMUM ?$')
      IQFIN=INTGET(0,'Q MAXIMUM ?$')
      ITER=INTGET(0,'NOMBRE D''ITERATIONS ?$')
      CALL OUTSTR(0,'F INITIAUX ?$')
      CALL OUTSTR(0,'LES SF SONT LES TAILLES DE F$')
      CALL GETVOL(0,'VOLUME$',VOLF)
      CALL GETFIL(0,'FICHIER$',FILF)
      CALL OUTSTR(0,'RESULTATS ?$')
      CALL OUTSTR(0,'LES SF SONT LES VALEURS DE Q$')
      CALL GETVOL(0,'VOLUME$',VOLR)
      CALL GETFIL(0,'FICHIER$',FILR)
      CALL OUTSTR(0,'CHANGER UL 3$')
      PAUSE
      DO 3 NP=IPDEB,IPFIN,2
      WRITE(3,100)NP
100   FORMAT(1H ,'LA TAILLE DE F EST',I2,//)
```

```
      DO 3 NQ=IQDEB,IQFIN
      WRITE(3,101)NQ
  101 FORMAT(1H ,/,'LE NOMBRE DE LAMBDAS EST',I3)
      NTF(6)=NP*NP
      NTF(7)=NTF(6)
      NTF(8)=2*NTF(1)
      NTF(9)=2*NTF(1)
      NTF(10)=2*NQ*NQ
      NTF(11)=2*NQ
      NTF(12)=2*NP*NP
      NTF(13)=NQ*(NQ+1)
      NTF(14)=NTF(13)
      CALL EXEC(IER,7,NTF,0,0,RIFLEC,NP,VOLF,FILF)
      DO 4 INUM=1,ITER
      CALL CALGRD(IER,XNMGD,ERRO,IFMT,NP,NQ,NTF)
      XNM=SQRT(XNMGD)
      IF(INUM.GT.1)GO TO 40
      RHO=1./(10.*XNM)
   40 IRHO=0
      JRHO=0
      KRHO=0
   12 IF(KRHO.EQ.20)GO TO 3001
      CALL CALFPR(IFMT,NP,RHO,IZP,IQS,NTF)
      CALL CALCRI(IER,IFMT,NP,NQ,ERR1,NTF)
      DELT=ERRO-ERR1
      DELT=DELT/RHO
      XTST=XNMGD/2.
      IF(DELT.GE.XTST)GO TO 10
      IF(IRHO.EQ.1)GO TO 11
      RHO=RHO/2.
      KRHO=KRHO+1
      JRHO=1
      GO TO 12
   11 RHO=RHO/2.
      CALL CALFPR(IFMT,NP,RHO,IZP,IQS,NTF)
      CALL CALCRI(IER,IFMT,NP,NQ,ERR1,NTF)
      GO TO 13
   10 IF(JRHO.EQ.1)GO TO 13
      RHO=2.*RHO
      KRHO=KRHO+1
      IRHO=1
      GO TO 12
   13 CALL CALNF(IFMT,NP,NQ,RHO,ERR1,XNMGG,IZP,IQS,NTF)
    4 CONTINUE
 3000 CALL IMPRES(NP,NQ,NTF,VOLR,FILR)
    3 CONTINUE
      STOP
 1000 CALL OUTSTR(0,'IMAGE NON CARREE$')
      GO TO 1002
 1001 CALL OUTSTR(0,'IMAGE NON FLOTTANTE$')
 1002 CALL FERMNF(NFG)
      GO TO 2000
 3001 CALL OUTSTR(0,'JE NE TROUVE PAS DE RHO !$')
      GO TO 3000
      END
```

```
$ASSM
**RIFINT
RIFINT   PROG
$FORT
         SUBROUTINE RIFINT(XRG,XIG,POIDS,WR,WI,NTFIX,NFG,SFGR,SFGI
        1,IFMT,XNMGG)
         DIMENSION XRG(1),XIG(1),F(1),IFMT(4),NTFIX(5),F1(1)
         DIMENSION POIDS(1)
         DOUBLE PRECISION DWR,DWI,SCALE,TETA,DPI,WR(1),WI(1)
         N=IFMT(1)
         NS2=N/2+1
         NTOT=N*NS2
         DPI=8.D0*DATAN(1.D0)
         SCALE=DPI/FLOAT(N)
         WR(1)=1.D0
         WI(1)=0.D0
         DO 2 I=2,N
         TETA=FLOAT(I-1)*SCALE
         DWR=DCOS(TETA)
         DWI=DSIN(TETA)
         WR(I)=DWR
2        WI(I)=DWI
         DO 12 I=1,NTOT
12       POIDS(I)=1.
         I=IASK(0,'FONCTION DE POIDS O/N $?')
         IF(I.NE.1)GO TO 9
         CALL FICSOR('POIDS$',NFP,SFP,IFMT)
         CALL LECTUR(NFP,SFP,IFMT,NS2,POIDS)
         CALL FERMSF(NFP,SFP)
9        CALL LECTUR(NFG,SFGR,IFMT,NS2,XRG)
         CALL FERMSF(NFG,SFGR)
         IF(SFGI.EQ.0.)GO TO 6
         CALL LECTUR(NFG,SFGI,IFMT,NS2,XIG)
         CALL FERMSF(NFG,SFGI)
         GO TO 8
6        DO 7 I=1,NTOT
7        XIG(I)=0.
8        XNMGG=0.
         DO 4 I=1,NTOT
4        CALL CALERR(XRG(I),XIG(I),POIDS(I),XNMGG,I,N)
         RETURN
         END $ASSM
**RIFLEC
RIFLEC   PROG
$FORT
         SUBROUTINE RIFLEC(XRG,XIG,POIDS,WR,WI,F,F1,NTFIX,NF,VOLF,FILF)
         DIMENSION F(1),F1(1),NTFIX(7),FILF(2),IFMTF(4),CNP(3)
         DO 3 I=1,3
3        CNP(I)='     '
         CALL ICODE(NF,CNP,LP)
         IFMTF(1)=NP
         IFMTF(2)=NP
         IFMTF(3)=4
         IFMTF(4)=1
         CALL SORFIC(VOLF,FILF,NF,CNP,IFMTF)
         CALL LECTUR(NF,CNP,IFMTF,NP,F)
         CALL FERMSF(NF,CNP)
         NPP=NP*NP
         XNORM=0.
         DO 1 I=1,NPP
```

```
1       XNORM=XNORM+F(I)*F(I)
        XNORM=SQRT(XNORM)
        DO 2 I=1,NPP
        F(I)=F(I)/XNORM
2       F1(I)=F(I)
        RETURN
        END $BATCH
$ASSM
**RIFFFT
RIFFFT    PROG
$FORT
        SUBROUTINE RIFFFT(XRG,XIG,POIDS,WR,WI,F,F1,XRF,XIF,NTFIX,IFMT,NP)
        DIMENSION XRG(1),XIG(1),F(1)
        DIMENSION NTFIX(9),IFMT(4),F1(1)
        DOUBLE PRECISION XRF(1),XIF(1),WR(1),WI(1)
        N=IFMT(1)
        NS2=N/2+1
        NML=NP/2
        NML1=NML+1
        DO 1 I=1,NS2
        DO 1 J=1,N
        INDXF=(I-1)*N+J
        XRF(INDXF)=0.
        XIF(INDXF)=0.
        IORIG=NML*NP+NML
        DO 2 K=1,NML1
        DO 2 L=1,NML1
        INDF=IORIG+(K-1)*NP+L
        INDI=K-1
        INDJ=L-1
        CALL CALIND(INDI,INDJ,I,J,N)
2       CALL CALFOU(XRF,XIF,F,WR,WI,INDI,INDJ,INDXF,INDF)
        IORIG=IORIG+1
        DO 3 K=1,NML1
        DO 3 L=1,NML
        INDF=IORIG+(K-1)*NP-L
        INDI=K-1
        INDJ=N-L
        CALL CALIND(INDI,INDJ,I,J,N)
3       CALL CALFOU(XRF,XIF,F,WR,WI,INDI,INDJ,INDXF,INDF)
        IORIG=NML*NP-NML1
        DO 4 K=1,NML
        DO 4 L=1,NML1
        INDF=IORIG-(K-1)*NP+L
        INDI=N-K
        INDJ=L-1
        CALL CALIND(INDI,INDJ,I,J,N)
4       CALL CALFOU(XRF,XIF,F,WR,WI,INDI,INDJ,INDXF,INDF)
        IORIG=IORIG+1
        DO 1 K=1,NML
        DO 1 L=1,NML

INDF=IORIG-(K-1)*NP-L
        INDI=N-K
        INDJ=N-L
        CALL CALIND(INDI,INDJ,I,J,N)
1       CALL CALFOU(XRF,XIF,F,WR,WI,INDI,INDJ,INDXF,INDF)
        RETURN
        END
```

```
$ASSM
**CALFOU
CALFOU    PROG
$FORT
      SUBROUTINE CALFOU(XRF,XIF,F,WR,WI,INDI,INDJ,INDXF,INDF)
      DIMENSION F(1)
      DOUBLE PRECISION XRF(1),XIF(1),WR(1),WI(1)
      DOUBLE PRECISION XWR,XWI
      XWR=WR(INDI)*WR(INDJ)-WI(INDI)*WI(INDJ)
      XWI=-WR(INDI)*WI(INDJ)-WI(INDI)*WR(INDJ)
      XRF(INDXF)=XRF(INDXF)+F(INDF)*XWR
      XIF(INDXF)=XIF(INDXF)+F(INDF)*XWI
      RETURN
      END $ASSM
**CALIND
CALIND    PROG
$FORT
      SUBROUTINE CALIND(INDI,INDJ,I,J,N)
      NUM=(I-1)*INDI
      NQUOT=NUM/N
      INDI=NUM-N*NQUOT+1
      NUM=(J-1)*INDJ
      NQUOT=NUM/N
      INDJ=NUM-N*NQUOT+1
      RETURN
      END $BEND
$ASSM
**RIFDLT
RIFDLT    PROG
$FORT
      SUBROUTINE RIFDLT(XRG,XIG,POIDS,WR,WI,F,F1,XRF,XIF,PSI,XLAMBD,
     1GRAD,SL,SL1,NTFIX,IFMT,NP,NQ,ERRO)
      DIMENSION XRG(1),XIG(1),POIDS(1),F(1),F1(1),IFMT(4)
      DOUBLE PRECISION XRF(1),XIF(1),PSI(1),SL(1),SL1(1)
      DOUBLE PRECISION RNORM
      NQQ=NQ*NQ
      NQ1=NQ+1
      NQ2=NQ1+NQ
      NQ3=(NQ*(NQ+1))/2
      CALL CALPSI(XRF,XIF,POIDS,SL,NQ,IFMT(1),SL1)
      CALL RGPSI(PSI,SL,NQ)
      XMAX=0.
      IO=0
      DO 3 I=1,NQ
      IO=IO+I-1
      DO 3 J=1,I
      INDP=IO+J
      AUX=SL(INDP)
      IF(ABS(AUX).GT.XMAX) XMAX=ABS(AUX)
3     CONTINUE
      XNORM=0.
      DO 2 I=1,NQQ
2     XNORM=XNORM+PSI(I)*PSI(I)
      XNORM=SQRT(XNORM)
      XNORM=(XNORM+XMAX)/2.
      TAU=1.E-10*XNORM
```

```
              RNORM=XNORM
              CALL CALLBD(XRF,XIF,POIDS,XRG,XIG,NQ,IFMT(1),XLAMBD)
              CALL HFTI(PSI,NQ,NQ,XLAMBD,1,TAU,KRANK,RNORM,SL(1),SL(NQ1)
             1,SL(NQ2))
              CALL CALDLT(XRF,XIF,POIDS,XRG,XIG,XLAMBD,NQ,IFMT(1),ERRO)
              RETURN
              END $BATCH
$ASSM
**RIFGRD
RIFGRD    PROG
$FORT
              SUBROUTINE RIFGRD(XRG,XIG,POIDS,WR,WI,F,F1,XRF,XIF,PSI
             1,XLAMBD,GRAD,SL,SL1,NTFIX,IFMT,NP,XNMGD)
              DIMENSION IFMT(4)
              DOUBLE PRECISION XRF(1),XIF(1),WR(1),WI(1),GRAD(1)
              DOUBLE PRECISION XWR,XWI
              N=IFMT(1)
              N2=N*N
              NS2=N/2
              NML=NS2*N
              NP2=NP/2
              NP21=NP2+1
              NPLACE=NML+NS2+1
              NS21=NS2+1
              NPP=NP*NP
              DO 3 I=1,NP
              IF(I.GT.NP21)GO TO 30
              IC=I
              IQ=((I-1)+NP2)*NP
              GO TO 31
30            IC=N-NP+I
              IQ=((I-1)-NP21)*NP
31            NMLI=NS2*(IC-1)
              NUM=NMLI/N
              INDWI=NMLI-NUM*N+1
              DO 3 J=1,NP
              IF(J.GT.NP21)GO TO 40
              JC=J
              JQ=J+NP2
              GO TO 41
40            JC=N-NP+J
              JQ=J-NP21
41            NMLJ=NS2*(JC-1)
              NUM=NMLJ/N
              INDWJ=NMLJ-NUM*N+1
              INDG=IQ+JQ
              GRAD(INDG)=XRF(1)+XRF(NML+1)*WR(INDWI)+XRF(NS2+1)*WR(INDWJ)
              GRAD(INDG)=GRAD(INDG)-XIF(NML+1)*WI(INDWI)-XIF(NS21)*WI(INDWJ)
              GRAD(INDG)=GRAD(INDG)/N2
              XWR=WR(INDWI)*WR(INDWJ)-WI(INDWI)*WI(INDWJ)
              XWI=WR(INDWI)*WI(INDWJ)+WI(INDWI)*WR(INDWJ)
              GRAD(INDG)=GRAD(INDG)+(-XIF(NPLACE)*XWI+XRF(NPLACE)*XWR)/N2
              DO 2 L=2,NS2
              CALL DOGRAD(XRF,XIF,L,GRAD,INDG,IC,JC,1,L,N,WR,WI)
              INDF=NML+L
2             CALL DOGRAD(XRF,XIF,INDF,GRAD,INDG,IC,JC,NS21,L,N,WR,WI)
              DO 3 K=2,NS2
              DO 3 L=1,N
              INDF=(K-1)*N+L
3             CALL DOGRAD(XRF,XIF,INDF,GRAD,INDG,IC,JC,K,L,N,WR,WI)
              XNMGD=0.
```

```
        DO 11 I=1,NPP
11      XNMGD=XNMGD+GRAD(I)*GRAD(I)
        RETURN
100     FORMAT(1H ,/,5D15.5)
        END $ASSM
**DOGRAD
DOGRAD   PROG
$FORT
        SUBROUTINE DOGRAD(XRF,XIF,INDF,GRAD,INDG,I,J,K,L,N,WR,WI)
        DOUBLE PRECISION XRF(1),XIF(1),GRAD(1),WR(1),WI(1)
        DOUBLE PRECISION AUXR,AUXI
        N2=N*N
        NUM=((I-1)*(K-1))/N
        INDWI=((I-1)*(K-1))-NUM*N+1
        NUM=((J-1)*(L-1))/N
        INDWJ=((J-1)*(L-1))-NUM*N+1
        AUXR=WR(INDWI)*WR(INDWJ)-WI(INDWI)*WI(INDWJ)
        AUXI=WR(INDWI)*WI(INDWJ)+WI(INDWI)*WR(INDWJ)
        GRAD(INDG)=GRAD(INDG)+2.*(XRF(INDF)*AUXR-XIF(INDF)*AUXI)/N2
        RETURN
        END $BEND
$BATCH
$ASSM
**CALNF
CALNF    PROG
$FORT
        SUBROUTINE CALNF(IFMT,NP,NO,RHO,ERR1,XNMGG,IZP,IQS,NTF)
        DIMENSION NTF(14),IFMT(4)
        EXTERNAL RIFNF,RIFNFZ,RIFNFQ
        IF(IZP.EQ.2)GO TO 1
        IF(IQS.EQ.1)GO TO 2
        CALL EXEC(IER,14,NTF,0,0,RIFNFZ,IFMT,NP,NO,RHO,ERR1,XNMGG)
        RETURN
2       CALL EXEC(IER,14,NTF,0,0,RIFNFQ,IFMT,NP,NO,RHO,ERR1,XNMGG)
        RETURN
1       CALL EXEC(IER,14,NTF,0,0,RIFNF,IFMT,NP,NO,RHO,ERR1,XNMGG)
        RETURN
        END $ASSM
**CALFPR
CALFPR   PROG
$FORT
        SUBROUTINE CALFPR(IFMT,NP,RHO,IZP,IQS,NTF)
        DIMENSION IFMT(4),NTF(14)
        EXTERNAL RIFFPR,RIFFPZ,RIFFPQ
        IF(IZP.EQ.2)GO TO 1
        IF(IQS.EQ.1)GO TO 2
        CALL EXEC(IER,14,NTF,0,0,RIFFPZ,IFMT,NP,RHO)
        RETURN
2       CALL EXEC(IER,14,NTF,0,0,RIFFPQ,IFMT,NP,RHO)
        RETURN
```

```
1       CALL EXEC(IER,14,NTF,0,0,RIFFFR,IFMT,NP,RHO)
        RETURN
        END $ASSM
**RIFNF
RIFNF   PROG
$FORT
        SUBROUTINE RIFNF(XRG,XIG,POIDS,WR,WI,F,F1,XRF,XIF,PSI,XLAMBD,
       1GRAD,SL,SL1,NTFIX,IFMT,NP,NQ,RHO,ERRO,XNMGG)
        DIMENSION F(1),F1(1)
        DOUBLE PRECISION GRAD(1),XLAMBD(1)
        XNORM=0.
        DO 2 I=1,NP
        DO 2 J=1,NP
        INDF=(I-1)*NP+J
        F(INDF)=F1(INDF)-RHO*GRAD(INDF)
2       XNORM=XNORM+ABS(F(INDF))
        DO 1 I=1,NP
        DO 11 J=1,NP
        IND=(I-1)*NP+J
        F(IND)=F(IND)/XNORM
11      F1(IND)=F(IND)
1       CONTINUE
        ERR=SQRT(ERRO/XNMGG)
        WRITE(3,101)ERR,RHO
101     FORMAT(1H ,'ERREUR QUADRATIQUE =',E15.5,'RHO =',E15.5)
        RETURN
        END $ASSM
**RIFNFZ
RIFNFZ  PROG
$FORT
        SUBROUTINE RIFNFZ(XRG,XIG,POIDS,WR,WI,F,F1,XRF,XIF,PSI,XLAMBD,
       1GRAD,SL,SL1,NTFIX,IFMT,NP,NQ,RHO,ERRO,XNMGG)
        DIMENSION F(1),F1(1)
        DOUBLE PRECISION GRAD(1),XLAMBD(1)
        NPP=NP*NP
        DO 2 I=1,NPP
2       F(I)=F1(I)-RHO*GRAD(I)
        DO 12 I=1,NP
        DO 12 J=1,I
        IND1=(I-1)*NP+J
        IND2=(NP-I)*NP+NP-J+1
        F(IND1)=(F(IND1)+F(IND2))/2.
12      F(IND2)=F(IND1)
        XNORM=0.
        DO 13 I=1,NPP
13      XNORM=XNORM+ABS(F(I))
        DO 1 I=1,NP
        DO 11 J=1,NP
        IND=(I-1)*NP+J
        F(IND)=F(IND)/XNORM
11      F1(IND)=F(IND)
1       CONTINUE
        ERR=SQRT(ERRO/XNMGG)
        WRITE(3,101)ERR,RHO
101     FORMAT(1H ,'ERREUR QUADRATIQUE =',E15.5,'RHO =',E15.5)
        RETURN
        END
```

```
$ASSM
**RIFNFQ
RIFNFQ    PROG
$FORT
        SUBROUTINE RIFNFQ(XRG,XIG,POIDS,WR,WI,F,F1,XRF,XIF,PSI,XLAMBD,
       1GRAD,SL,SL1,NTFIX,IFMT,NP,NQ,RHO,ERRO,XNMGG)
        DIMENSION F(1),F1(1)
        DOUBLE PRECISION GRAD(1),XLAMBD(1)
        NPP=NP*NP
        NP2=NP/2+1
        DO 2 I=1,NPP
2       F(I)=F1(I)-RHO*GRAD(I)
        DO 12 I=1,NP
        DO 12 J=1,I
        IND1=(I-1)*NP+J
        IND2=(NP-I)*NP+NP-J+1
        F(IND1)=(F(IND1)+F(IND2))/2.
12      F(IND2)=F(IND1)
        DO 14 I=1,NP
        DO 14 J=1,NP2
        IND1=(I-1)*NP+J
        IND2=(I-1)*NP+NP-J+1
        F(IND1)=(F(IND1)+F(IND2))/2.
14      F(IND2)=F(IND1)
        XNORM=0.
        DO 13 I=1,NPP
13      XNORM=XNORM+ABS(F(I))
        DO 1 I=1,NP
        DO 11 J=1,NP
        IND=(I-1)*NP+J
        F(IND)=F(IND)/XNORM
11      F1(IND)=F(IND)
1       CONTINUE
        ERR=SQRT(ERRO/XNMGG)
        WRITE(3,101)ERR,RHO
101     FORMAT(1H ,'ERREUR QUADRATIQUE =',E15.5,'RHO =',E15.5)
        RETURN
        END $ASSM
**RIFFPR
RIFFPR    PROG
$FORT
        SUBROUTINE RIFFPR(XRG,XIG,POIDS,WR,WI,F,F1,XRF,XIF,PSI,XLAMBD
       1,GRAD,SL,SL1,NTFIX,IFMT,NP,RHO)
        DIMENSION F(1),F1(1)
        DOUBLE PRECISION GRAD(1)
        XNORM=0.
        DO 2 I=1,NP
        DO 2 J=1,NP
        INDF=(I-1)*NP+J
        F(INDF)=F1(INDF)-RHO*GRAD(INDF)
2       XNORM=XNORM+ABS(F(INDF))
        NPP=NP*NP
        DO 1 I=1,NPP
1       F(I)=F(I)/XNORM
        RETURN
        END
```

```
$ASSM
**RIFFPZ
RIFFPZ    PROG
$FORT
      SUBROUTINE RIFFPZ(XRG,XIG,POIDS,WR,WI,F,F1,XRF,XIF,PSI,XLAMBD
     1,GRAD,SL,SL1,NTFIX,IFMT,NP,RHO)
      DIMENSION F(1),F1(1)
      DOUBLE PRECISION GRAD(1)
      NPP=NP*NP
      DO 2 I=1,NPP
2     F(I)=F1(I)-RHO*GRAD(I)
      DO 4 I=1,NP
      DO 4 J=1,I
      IND1=(I-1)*NP+J
      IND2=(NP-I)*NP+NP-J+1
      F(IND1)=(F(IND1)+F(IND2))/2.
4     F(IND2)=F(IND1)
      XNORM=0.
      DO 5 I=1,NPP
5     XNORM=XNORM+ABS(F(I))
      DO 1 I=1,NPP
1     F(I)=F(I)/XNORM
      RETURN
      END $ASSM
**RIFFPQ
RIFFPQ    PROG
$FORT
      SUBROUTINE RIFFPQ(XRG,XIG,POIDS,WR,WI,F,F1,XRF,XIF,PSI,XLAMBD
     1,GRAD,SL,SL1,NTFIX,IFMT,NP,RHO)
      DIMENSION F(1),F1(1)
      DOUBLE PRECISION GRAD(1)
      NPP=NP*NP
      NP2=NP/2
      DO 2 I=1,NPP
2     F(I)=F1(I)-RHO*GRAD(I)
      DO 4 I=1,NP
      DO 4 J=1,I
      IND1=(I-1)*NP+J
      IND2=(NP-I)*NP+NP-J+1
      F(IND1)=(F(IND1)+F(IND2))/2.
4     F(IND2)=F(IND1)
      DO 6 I=1,NP
      DO 6 J=1,NP2
      IND1=(I-1)*NP+J
      IND2=(I-1)*NP+NP-J+1
      F(IND1)=(F(IND1)+F(IND2))/2.
6     F(IND2)=F(IND1)
      XNORM=0.
      DO 5 I=1,NPP
5     XNORM=XNORM+ABS(F(I))
      DO 1 I=1,NPP
1     F(I)=F(I)/XNORM
      RETURN
      END
```

```
$BEND
$BATCH
$ASSM
**CALPSI
CALPSI    PROG
$FORT
          SUBROUTINE CALPSI(XRF,XIF,POIDS,PSI,NQ,N,TRAV)
          DOUBLE PRECISION XRF(1),XIF(1),PSI(1),TRAV(1)
          INDPSI=0
          DO 1 I=1,NQ
          DO 1 J=1,I
          INDPSI=INDPSI+1
1         PSI(INDPSI)=0.D0
          NS2=N/2
          IND=1
          XNB=1.
          CALL DOPSI(PSI,POIDS,TRAV,NQ,IND,XRF,XIF,XNB)
          IND=NS2+1
          CALL DOPSI(PSI,POIDS,TRAV,NQ,IND,XRF,XIF,XNB)
          IND=NS2*N+1
          CALL DOPSI(PSI,POIDS,TRAV,NQ,IND,XRF,XIF,XNB)
          IND=IND+NS2
          CALL DOPSI(PSI,POIDS,TRAV,NQ,IND,XRF,XIF,XNB)
          XNB=2.
          DO 2 I=2,NS2
          DO 2 J=1,2
          IND=(J-1)*N*NS2+I
2         CALL DOPSI(PSI,POIDS,TRAV,NQ,IND,XRF,XIF,XNB)
          DO 3 I=1,N
          DO 3 J=2,NS2
          IND=(J-1)*N+I
3         CALL DOPSI(PSI,POIDS,TRAV,NQ,IND,XRF,XIF,XNB)
          RETURN
          END $ASSM
**DOPSI
DOPSI     PROG
$FORT
          SUBROUTINE DOPSI(PSI,POIDS,TRAV,NQ,IND,XRF,XIF,XNB)
          DOUBLE PRECISION PSI(1),TRAV(2),XRF(1),XIF(1)
          DOUBLE PRECISION AUX
          DIMENSION POIDS(1)
          TRAV(1)=(XRF(IND)*XRF(IND)+XIF(IND)*XIF(IND))*POIDS(IND)
          TRAV(2)=0.D0
          PSI(1)=PSI(1)+XNB*TRAV(1)
          KO=1
          DO 1 K=2,NQ
          KO=KO+K-1
          INDT=(K-1)*2+1
          TRAV(INDT)=TRAV(INDT-2)*XRF(IND)-TRAV(INDT-1)*XIF(IND)
          TRAV(INDT+1)=TRAV(INDT-2)*XIF(IND)+TRAV(INDT-1)*XRF(IND)
          IF(DABS(TRAV(INDT)).LE.1.D-40) TRAV(INDT)=0.D0
          INDT1=INDT+1
          IF(DABS(TRAV(INDT1)).LE.1.D-40) TRAV(INDT1)=0.D0
1         PSI(KO)=PSI(KO)+XNB*TRAV(INDT)
          KO=1
          DO 2 I=2,NQ
          KO=KO+I
          K1=KO
          DO 2 J=I,NQ
          INDI=2*J
```

```
      INDR=INDI-1
      AUX=TRAV(INDR)
      TRAV(INDR)=TRAV(INDR)*XRF(IND)+TRAV(INDI)*XIF(IND)
      TRAV(INDI)=-AUX*XIF(IND)+TRAV(INDI)*XRF(IND)
      IF(DABS(TRAV(INDR)).LE.1.D-40)TRAV(INDR)=0.DO
      IF(DABS(TRAV(INDI)).LE.1.D-40)TRAV(INDI)=0.DO
      PSI(K1)=PSI(K1)+XNB*TRAV(INDR)
2     K1=K1+J
      RETURN
      END
```

```
$SSM
**RGPSI
RGPSI     PROG
$FORT
      SUBROUTINE RGPSI(PSI,SL,NQ)
      DOUBLE PRECISION PSI(1),SL(1)
      IO=0
      DO 1 I=1,NQ
      IO=IO+I-1
      DO 1 J=1,I
      INDS=IO+J
      INDP=(I-1)*NQ+J
      PSI(INDP)=SL(INDS)
      INDP=(J-1)*NQ+I
      PSI(INDP)=SL(INDS)
1     CONTINUE
      RETURN
      END
```

```
$ASSM
**CALLBD
CALLBD    PROG
$FORT
      SUBROUTINE CALLBD(XRF,XIF,POIDS,XRG,XIG,NQ,N,XLAMBD)
      DOUBLE PRECISION XRF(1),XIF(1),XRG(1),XIG(1),XLAMBD(1)
      DO 1 I=1,NQ
1     XLAMBD(I)=0.DO
      NS2=N/2
      IND=1
      XNB=1.
      CALL DOLAM(XRF,XIF,POIDS,XRG,XIG,NQ,N,XLAMBD,IND,XNB)
      IND=NS2+1
      CALL DOLAM(XRF,XIF,POIDS,XRG,XIG,NQ,N,XLAMBD,IND,XNB)
      IND=NS2*N+1
      CALL DOLAM(XRF,XIF,POIDS,XRG,XIG,NQ,N,XLAMBD,IND,XNB)
      IND=IND+NS2
      CALL DOLAM(XRF,XIF,POIDS,XRG,XIG,NQ,N,XLAMBD,IND,XNB)
      XNB=2.
      DO 2 I=2,NS2
      DO 2 J=1,2
      IND=(J-1)*N*NS2+I
2     CALL DOLAM(XRF,XIF,POIDS,XRG,XIG,NQ,N,XLAMBD,IND,XNB)
      DO 3 I=1,N
      DO 3 J=2,NS2
      IND=(J-1)*N+I
3     CALL DOLAM(XRF,XIF,POIDS,XRG,XIG,NQ,N,XLAMBD,IND,XNB)
      RETURN
      END
```

```
$ASSM
**DOLAM
DOLAM     PROG
$FORT
      SUBROUTINE DOLAM(XRF,XIF,POIDS,XRG,XIG,NQ,N,XLAMBD,IND,XNB)
      DIMENSION XRG(1),XIG(1),POIDS(1)
      DOUBLE PRECISION XRF(1),XIF(1),XLAMBD(1),AUXR,AUXI,AUX
      AUXR=(XRF(IND)*XRG(IND)+XIF(IND)*XIG(IND))*POIDS(IND)
      AUXI=(-XRF(IND)*XIG(IND)+XIF(IND)*XRG(IND))*POIDS(IND)
      XLAMBD(1)=XLAMBD(1)+XNB*AUXR
      DO 1 I=2,NQ
      AUX=AUXR
      AUXR=AUXR*XRF(IND)-AUXI*XIF(IND)
      AUXI=AUX*XIF(IND)+AUXI*XRF(IND)
      IF(DABS(AUXR).LE.1.D-40)AUXR=0.D0
      IF(DABS(AUXI).LE.1.D-40)AUXI=0.D0
  1   XLAMBD(I)=XLAMBD(I)+XNB*AUXR
      RETURN
      END $ASSM
**CALDLT
CALDLT    PROG
$FORT
      SUBROUTINE CALDLT(XRF,XIF,POIDS,XRG,XIG,XLAMBD,NQ,N,ERR)
      DIMENSION XRG(1),XIG(1),POIDS(1)
      DOUBLE PRECISION AR,AI,BR,BI,PUISR,PUISI
      DOUBLE PRECISION XRF(1),XIF(1),XLAMBD(1)
      ERR=0.D0
      NS2=N/2
      NS21=NS2+1
      NML=N*NS2+1
      NTOT=N*NS21
      DO 1 I=1,NTOT
      AR=0.D0
      AI=0.D0
      BR=0.D0
      BI=0.D0
      PUISR=1.D0
      PUISI=0.D0
      DO 2 J=1,NQ
      AUX=PUISR
      BR=BR+J*XLAMBD(J)*PUISR
      BI=BI+J*XLAMBD(J)*PUISI
      PUISR=PUISR*XRF(I)-PUISI*XIF(I)
      PUISI=AUX*XIF(I)+PUISI*XRF(I)
      IF(DABS(PUISR).LE.1.D-40)PUISR=0.D0
      IF(DABS(PUISI).LE.1.D-40)PUISI=0.D0
      AR=AR+XLAMBD(J)*PUISR
  2   AI=AI+XLAMBD(J)*PUISI
      AR=AR-XRG(I)
      AI=AI-XIG(I)
      CALL CALERR(AR,AI,POIDS(I),ERR,I,N)
      XRF(I)=(AR*BR+AI*BI)*POIDS(I)
  1   XIF(I)=(-AR*BI+AI*BR)*POIDS(I)
      RETURN
      END
```

```
$ASSM
**CALERR
CALERR    PROG
$FORT
      SUBROUTINE CALERR(AR,AI,POIDS,ERR,I,N)
      DOUBLE PRECISION AR,AI
      NS2=N/2
      NS21=NS2+1
      NML=N*NS2+1
      NMLL=NML+NS2
      NFIN=NML+N
      SUP=(AR*AR+AI*AI)*POIDS
      ERR=ERR+SUP
      IF (I.LE.N) RETURN
      IF (I.GE.NML) RETURN
      ERR=ERR+SUP
      RETURN
      END $BEND
$ASSM
**CALGRD
CALGRD    PROG
$FORT
      SUBROUTINE CALGRD(IER,XNMGD,ERRO,IFMT,NP,NQ,NTF)
      EXTERNAL RIFFFT,RIFDLT,RIFGRD
      CALL EXEC(IER,9,NTF,0,0,RIFFFT,IFMT,NP)
      CALL EXEC(IER,14,NTF,0,0,RIFDLT,IFMT,NP,NQ,ERRO)
      IF (IER.EQ.13) RETURN
      CALL EXEC(IER,14,NTF,0,0,RIFGRD,IFMT,NP,XNMGD)
      RETURN
      END $ASSM
**CALCRI
CALCRI    PROG
$FORT
      SUBROUTINE CALCRI(IER,IFMT,NP,NQ,ERR1,NTF)
      EXTERNAL RIFFFT,RIFDLT
      CALL EXEC(IER,9,NTF,0,0,RIFFFT,IFMT,NP)
      CALL EXEC(IER,14,NTF,0,0,RIFDLT,IFMT,NP,NQ,ERR1)
      RETURN
      END $BATCH
$ASSM
**IMPRES
IMPRES    PROG
$FORT
      SUBROUTINE IMPRES(NP,NQ,NTF)
      EXTERNAL RIFRES
      CALL EXEC(IER,14,NTF,0,0,RIFRES,NP,NQ)
      RETURN
      END
```

```
$ASSM
**RIFRES
RIFRES    PROG
$FORT
      SUBROUTINE RIFRES(XRG,XIG,POIDS,F,F1,WR,WI,XRF,XIF,PSI
     1,XLAMBD,GRAD,SL,SL1,NTF,NP,NQ)
      DIMENSION IFMT(4),SL(1)
      DOUBLE PRECISION XLAMBD(1)
      IFMT(1)=NP
      IFMT(2)=NP
      IFMT(3)=4
      IFMT(4)=1
      CALL FICSOR('VALEURS DE F$',NFF,SFF,IFMT)
      CALL ECRITU(NFF,SFF,IFMT,NP,F)
      CALL FERMSF(NFF,SFF)
      IFMT(1)=NQ
      IFMT(2)=1
      DO 1 I=1,NQ
1     SL(I)=XLAMBD(I)
      CALL FICSOR('VALEURS DES LAMBDAS$',NFF,SFF,IFMT)
      CALL ECRITU(NFF,SFF,IFMT,1,SL)
      CALL FERMSF(NFF,SFF)
      RETURN
      END $BEND
$ASSM
**HFTI
HFTI      PROG
$FORT
      SUBROUTINE HFTI(A,M,N,B,NB,TAU,KRANK,RNORM,H,G,IP)
      DIMENSION IP(1)
      DOUBLE PRECISION A(1),B(1),RNORM(1),H(1),G(1)
CDIMENSIONS DES TABLEAUX
C     A  M*N
C     B  MAX(M,N)*NB
C     H,G,IP  N
C     RNORM  NB
      DOUBLE PRECISION SM,DZERO,TMP
      MDB=MAXO(M,N)
      DZERO=0.D0
      FACTOR=0.001
C
      K=0
      LDIAG=MINO(M,N)
      IF(LDIAG.LE.0) GO TO 270
      DO 80 J=1,LDIAG
      IF(J.EQ.1) GO TO 20
C
C     UPDATE SQUARED COLUMN LENGTHS
C     FIND LMAX
C
      LMAX=J
      DO 10 L=J,N
      INDA=(L-1)*M+J-1
      H(L)=H(L)-A(INDA)*A(INDA)
      IF(H(L).GT.H(LMAX)) LMAX=L
10    CONTINUE
      XTEST=HMAX+FACTOR*H(LMAX)
      XTEST=XTEST-HMAX
      IF(XTEST) 20,20,50
C
```

```
C       COMPUTE SQUARED COLUMN LENGTHS
C       FIND LMAX
C
20      LMAX=J
        DO 40 L=J,N
        H(L)=0.
        DO 30 I=J,M
        INDA=(L-1)*M+I
30      H(L)=H(L)+A(INDA)*A(INDA)
        IF(H(L).GT.H(LMAX))LMAX=L
40      CONTINUE
        HMAX=H(LMAX)
C
C       LMAX HAS BEEN DETERMINED
C
C       DO COLUMN INTERCHANGES IF NEEDED
C
50      CONTINUE
        IP(J)=LMAX
        IF(IP(J).EQ.J)GO TO 70
        DO 60 I=1,M
        INDA=(J-1)*M+I
        TMP=A(INDA)
        INDX=(LMAX-1)*M+I
        A(INDA)=A(INDX)
60      A(INDX)=TMP
        H(LMAX)=H(J)
C
C       COMPUTE THE J-TH TRANSFORM
C       APPLY IT TO A AND B
C
70      JP1=J+1
        JO=(J-1)*M+1
        J1=JO+M
        NJ=N-J
        CALL H12(1,J,JP1,M,A(JO),1,H(J),A(J1),1,M,NJ)
80      CALL H12(2,J,JP1,M,A(JO),1,H(J),B,1,MDB,NB)
C
C       DETERMINE PSEUDO RANK USING TAU
C
        DO 90 J=1,LDIAG
        INDA=(J-1)*M+J
        IF(ABS(A(INDA)).LE.TAU)GO TO 100
90      CONTINUE
        K=LDIAG
        GO TO 110
100     K=J-1
110     KP1=K+1
C
C       COMPUTE THE NORMS OF RESIDUAL VECTORS
C
        IF(NB.LE.0)GO TO 140
        DO 130 JB=1,NB
        TMP=DZERO
        IF(KP1.GT.M)GO TO 130
        DO 120 I=KP1,M
        INDB=(JB-1)*MDB+I
120     TMP=TMP+B(INDB)*B(INDB)
130     RNORM(JB)=DSQRT(TMP)
140     CONTINUE
C
C       SPECIAL FOR PSEUDORANK=0
C
```

```
              IF(K.GT.0)GO TO 160
              IF(NB.LE.0)GO TO 270
              DO 150 JB=1,NB
              DO 150 I=1,N
              INDB=(JB-1)*MDB+I
150           B(INDB)=DZERO
              GO TO 270
C
C     IF THE PSEUDORANK INFERIOR TO N
C     COMPUTE HOUSEHOLDER DECOMPOSITION
C     FOR FIRST K ROWWS
C
160           IF(K.EQ.N)GO TO 180
              DO 170 II=1,K
              I=KP1-II
              I1=I-1
170           CALL H12(1,I,KP1,N,A(I),M,G(I),A,M,1,I1)
180           CONTINUE
C
C
              IF(NB.LE.0)GO TO 270
              DO 260 JB=1,NB
C
C     SOLVE THE K BY K TRIANGULAR SYSTEM
C
              DO 210 L=1,K
              SM=DZERO
              I=KP1-L
              IF(I.EQ.K)GO TO 200
              IP1=I+1
              DO 190 J=IP1,K
              INDB=(JB-1)*MDB+J
              INDA=(J-1)*M+I
190           SM=SM+A(INDA)*DBLE(B(INDB))
200           SM1=SM
              INDB=(JB-1)*MDB+I
              INDA=(I-1)*M+I
210           B(INDB)=(B(INDB)-SM1)/A(INDA)
C
C     COMPLETE CPMPUTATION OF SOLUTION VECTOR
C
              IF(K.EQ.N)GO TO 240
              DO 220 J=KP1,N
              INDB=(JB-1)*MDB+J
220           B(INDB)=DZERO
              DO 230 I=1,K
              INDB=(JB-1)*MDB+1
230           CALL H12(2,I,KP1,N,A(I),M,G(I),B(INDB),1,MDB,1)
C
C
C     REORDER THE SOLUTION VECTOR
C
C
240           DO 250 JJ=1,LDIAG
              J=LDIAG+1-JJ
              IF(IP(J).EQ.J)GO TO 250
              L=IP(J)
              INDB=(JB-1)*MDB+L
              INDBX=(JB-1)*MDB+J
              TMP=B(INDB)
              B(INDB)=B(INDBX)
              B(INDBX)=TMP
250           CONTINUE
```

```
260     CONTINUE
C
C
C       THE SOLUTION VECTORS ARE NOW
C       IN THE FIRST N ROWS OF B
C
270     KRANK=K
        RETURN
        END $ASSM
**H12
H12     PROG
$FORT
        SUBROUTINE H12(MODE,LPIVOT,L1,M,U,IUE,UP,C,ICE,ICV,NCV)
        DOUBLE PRECISION U(1),C(1)
        DOUBLE PRECISION SM,B,AUX,CL,ONE,CLINV,UP
        ONE=1.D0
C
        IF((0.GE.LPIVOT).OR.(LPIVOT.GE.L1).OR.(L1.GT.M))RETURN
        INDL=(LPIVOT-1)*IUE+1
        CL=DABS(U(INDL))
        IF(MODE.EQ.2)GO TO 60
C
C       CONSTRUCT TRANSFORMATION
C
        DO 10 J=L1,M
        INDU=(J-1)*IUE+1
10      CL=DMAX1(DABS(U(INDU)),CL)
        IF(CL)130,130,20
20      CLINV=ONE/CL
        SM=U(INDL)*CLINV
        SM=SM*SM
        DO 30 J=L1,M
        INDU=(J-1)*IUE+1
        AUX=U(INDU)*CLINV
30      SM=SM+AUX*AUX
        CL=CL*DSQRT(SM)
        IF(U(INDL))50,50,40
40      CL=-CL
50      UP=U(INDL)-CL
        U(INDL)=CL
        GO TO 70
C
C       APPLY TRANSFORMATION TO C
C
60      IF(CL)130,130,70
70      IF(NCV.LE.0)RETURN
        B=UP*U(INDL)
C
C       B MUST BE NONPOSITIVE
C
        IF(B)80,130,130
80      B=ONE/B
        I2=1-ICV+ICE*(LPIVOT-1)
        INCR=ICE*(L1-LPIVOT)
        DO 120 J=1,NCV
        I2=I2+ICV
        I3=I2+INCR
        I4=I3
        SM=C(I2)*UP
        DO 90 I=L1,M
```

```
              INDU=(I-1)*IUE+1
              SM=SM+C(I3)*U(INDU)
90            I3=I3+ICE
              IF(SM) 100,120,100
100           SM=SM*B
              C(I2)=C(I2)+SM*UP
              DO 110 I=L1,M
              INDU=(I-1)*IUE+1
              C(I4)=C(I4)+SM*U(INDU)
110           I4=I4+ICE
120           CONTINUE
130           RETURN
              END $ASSM
**TSTMEM
TSTMEM   PROG
$FORT
         SUBROUTINE TSTMEM(A,NTOT,N,NP,NQMX)
         NB1=4*NP*NP
         XNB2=3.5*N*N+11.*N
         XNB=NB1+XNB2-NTOT
         XNB=1.-XNB
         IF(XNB.LE.0.) GO TO 1
         NQMX=SQRT(XNB)/2.
         WRITE(3,100) NQMX
100      FORMAT(1H ,'LE NOMBRE MAX DE LAMBDAS EST ',I4)
         RETURN
1        CALL OUTSTR(0,'LA TAILLE DE F EST DEJA TROP GRANDE$')
         NQMX=0
         RETURN
         END $BATCH
$ASSM
**IMPRES
IMPRES   PROG
$FORT
         SUBROUTINE IMPRES(NP,NQ,NTF,VOLR,FILR)
         EXTERNAL RIFRES
         CALL EXEC(IER,14,NTF,0,0,RIFRES,NP,NQ,VOLR,FILR)
         RETURN
         END $ASSM
**RIFRES
RIFRES   PROG
$FORT
         SUBROUTINE RIFRES(XRG,XIG,POIDS,WR,WI,F,F1,XRF,XIF,PSI
        1,XLAMBD,GRAD,SL,SL1,NTF,NP,NQ,VOLR,FILR)
         DIMENSION IFMT(4),SL(1),F(1)
         DIMENSION FILR(2),FIL(2)
         DIMENSION SF(3),SUP(3)
         DOUBLE PRECISION XLAMBD(1)
         ADDRESS AFILR,AFIL,ASUP,AF,AL
         AF=A'FC'
         AL=A'LC'
         AFILR=A'FILR'
         AFIL=A'FIL'
         ASUP=A'SUP'
         FC='F     '
```

```
            LC='L    '
            DO 2 I=1,3
            SF(I)='   '
  2         SUP(I)='   '
            FIL(1)='   '
            FIL(2)='   '
            CALL ICODE(NQ,SF,LQ)
            IFMT(1)=NP
            IFMT(2)=NP
            IFMT(3)=4
            IFMT(4)=1
            LF=ILONG(AFILR,8,'  ')
            LF1=LF+1
            CALL ICODE(NP,SUP,LP)
            IF((LF+LP).GT.7)CALL ERMESF(17)
            CALL CONCAT(AFILR,AF,AFIL,LF,1)
            CALL CONCAT(AFIL,ASUP,AFIL,LF1,LP)
            CALL SORFIC(VOLR,FIL,NFF,SF,IFMT)
            CALL ECRITU(NFF,SF,IFMT,NP,F)
            CALL FERMNF(NFF)
            IFMT(1)=NQ
            IFMT(2)=1
            DO 1 I=1,NQ
  1         SL(I)=XLAMBD(I)
            CALL CONCAT(AFILR,AL,AFIL,LF,1)
            CALL CONCAT(AFIL,ASUP,AFIL,LF1,LP)
            CALL SORFIC(VOLR,FIL,NFF,SF,IFMT)
            CALL ECRITU(NFF,SF,IFMT,1,SL)
            CALL FERMNF(NFF)
            CALL OUTSTR(0,'F RESULTATS$')
            DO 3 I=1,NP
            IWD=(I-1)*NP+1
            IWF=I*NP
  3         WRITE(3,100)(F(IW),IW=IWD,IWF)
            CALL OUTSTR(0,'LAMBDAS$')
            WRITE(3,100)(SL(IW),IW=1,NQ)
100         FORMAT(1H ,/,5E15.5)
            RETURN
            END $BEND
            CALL INIVOL
            CALL CRIFID
            STOP
            END $ASSM
**CRIFID
CRIFID    PROG
$FORT
            SUBROUTINE CRIFID
            DIMENSION IFMT(4),NTF(14)
            EXTERNAL TSTMEM,RIFINT,RIFNF,RIFFFR
            CALL OUTSTR(0,'LA REPONSE A IDENTIFIER DOIT ETRE$')
            CALL OUTSTR(0,'      CARREE$')
            CALL OUTSTR(0,'      FLOTTANTE$')
2000        CALL FICENT('REPONSE A IDENTIFIER$',NFG,SFGR,IFMT)
            IF(IFMT(1).NE.IFMT(2))GO TO 1000
            IF(IFMT(4).NE.1)GO TO 1001
  6         IZP=IASK(0,'FILTRE ZERO-PHASE ?$')
            IF(IZP.EQ.0)GO TO 5
```

```
            IQS=IASK(O,'SYMETRIE QUADRILATERE ?$')
            SFGI=O.
            GO TO 1
 5          CALL FICSOR('PARTIE IMAGINAIRE$',NFG,SFGI,IFMT)
 1          WRITE(3,100) IFMT(1)
 100        FORMAT(1H ,'TAILLE DE LA REPONSE=',I4)
 2          NP=INTGET(O,'TAILLE DE F (IMPAIRE)?$')
            IF(NP.EQ.(NP/2)*2)GO TO 2
 3          CALL EXEC(IER,O,O,1,1,TSTMEM,IFMT(1),NP,NQMX)
            IF(NQMX.EQ.O)GO TO 1002
            IF(NQMX.EQ.1)GO TO 2
            NQ=INTGET(O,'COMBIEN DE LAMBDAS?$')
            IF(NQ.GT.NQMX)GO TO 3
            NS2=IFMT(1)/2+1
            NTF(1)=IFMT(1)*NS2
            NTF(2)=NTF(1)
            NTF(3)=NTF(1)
            NTF(4)=NP*NP
            NTF(5)=NTF(4)
            NTF(6)=2*IFMT(1)
            NTF(7)=NTF(6)
            NTF(8)=2*NTF(1)
            NTF(9)=2*NTF(1)
            NTF(10)=2*NQ*NQ
            NTF(11)=2*NQ
            NTF(12)=2*NP*NP
            NTF(13)=NQ*(NQ+1)
            NTF(14)=NTF(13)
 3003       CALL EXEC(IER,7,NTF,O,O,RIFINT,NFG,SFGR,SFGI,IFMT,NP,XNMGG)
            IF(IER.EQ.-1)GO TO 3002
            CALL CALGRD(IER,XNMGD,ERRO,IFMT,NP,NQ,NTF)
            IF(IER.EQ.13)GO TO 3000
            FACT=REALGT(O,'RHO ?$')
            XNM=SQRT(XNMGD)
            RHO=1./(FACT*XNM)
            WRITE(3,200) RHO
            GO TO 40
 4          CALL CALGRD(IER,XNMGD,ERRO,IFMT,NP,NQ,NTF)
            IF(IER.EQ.13)GO TO 3000
 40         IRHO=O
            JRHO=O
            KRHO=O
 12         IF(KRHO.EQ.20)GO TO 3001
            CALL CALFPR(IFMT,NP,RHO,IZP,IQS,NTF)
            CALL CALCRI(IER,IFMT,NP,NQ,ERR1,NTF)
            IF(IER.EQ.13)GO TO 3000
            DELT=ERRO-ERR1
            DELT=DELT/RHO
            XTST=XNMGD/2.
            IF(DELT.GE.XTST)GO TO 10
            IF(IRHO.EQ.1)GO TO 11
            RHO=RHO/2.
            KRHO=KRHO+1
            JRHO=1
            GO TO 12
 11         RHO=RHO/2.
            CALL CALFPR(IFMT,NP,RHO,IZP,IQS,NTF)
            CALL CALCRI(IER,IFMT,NP,NQ,ERR1,NTF)
            GO TO 13
 10         IF(JRHO.EQ.1)GO TO 13
            RHO=2.*RHO
            KRHO=KRHO+1
            IRHO=1
```

```
          GO TO 12
13        CALL CALNF(IFMT,NP,NQ,RHO,ERR1,XNMGG,IZP,IQS,NTF)
          WRITE(3,200)RHO
200       FORMAT(1H ,'RHO VAUT ',E15.5)
          I=IASK(0,'ENCORE O/N?$')
          IF(I.EQ.1)GO TO 4
          I=IASK(0,'NOUVEAU RHO O/N ?$')
          IF(I.NE.1)GO TO 3000
          RHO=REALGT(0,'COMBIEN ?$')
          GO TO 4
3000      CONTINUE
          I=IASK(0,'RESULTATS SAUVES O/N ?$')
          IF(I.EQ.1)CALL IMPRES(NP,NQ,NTF)
          I=IASK(0,'REINITIALISATION O/N$')
          IF(I.EQ.1)GO TO 1
          CALL FERMNF(NFG)
          RETURN
1000      CALL OUTSTR(0,'IMAGE NON CARREE$')
          GO TO 1002
1001      CALL OUTSTR(0,'IMAGE NON FLOTTANTE$')
1002      CALL FERMNF(NFG)
          GO TO 2000
3001      CALL OUTSTR(0,'JE NE TROUVE PAS DE RHO !$')
          GO TO 3000
3002      CALL FPANIC
          GO TO 3003
          RETURN
          END $ASSM
**RIFINT
RIFINT    PROG
$FORT
          SUBROUTINE RIFINT(XRG,XIG,POIDS,F,F1,WR,WI,NTFIX,NFG,SFGR,SFGI
         1,IFMT,NP,XNMGG)
          DIMENSION XRG(1),XIG(1),F(1),IFMT(4),NTFIX(6),F1(1)
          DIMENSION IFMTP(4),POIDS(1)
          DOUBLE PRECISION DWR,DWI,SCALE,TETA,DPI,WR(1),WI(1)
          N=IFMT(1)
          NPP=NP*NP
          NS2=N/2+1
          NTOT=N*NS2
          I=IASK(0,'F DONNEE AU CLAVIER O/N ?$')
          IF(I.EQ.1)GO TO 10
          IFMTP(1)=NP
          IFMTP(2)=NP
          IFMTP(3)=4
          IFMTP(4)=1
          CALL FICSOR('VALEURS INITIALES DE F$',NFF,SFF,IFMTP)
          CALL LECTUR(NFF,SFF,IFMTP,NP,F)
          CALL FERMNF(NFF)
          GO TO 11
10        CALL OUTSTR(0,'DONNER LES VALEURS INITIALES DE F$')
          DO 1 I=1,NP
          IDEB=(I-1)*NP+1
          WRITE(3,100)I
100       FORMAT(1H ,/,'LIGNE ',I4,/)
1         CALL REALCH(0,'$',0,NP,F(IDEB))
11        XNORM=0.
          DO 5 I=1,NPP
5         XNORM=XNORM+F(I)*F(I)
          XNORM=SQRT(XNORM)
```

```
              DO 3 I=1,NFP
              F(I)=F(I)/XNORM
3             F1(I)=F(I)
              DPI=8.D0*DATAN(1.D0)
              SCALE=DPI/FLOAT(N)
              WR(1)=1.D0
              WI(1)=0.D0
              DO 2 I=2,N
              TETA=FLOAT(I-1)*SCALE
              DWR=DCOS(TETA)
              DWI=DSIN(TETA)
              WR(I)=DWR
2             WI(I)=DWI
              IPNT=IGETPN(NFG,SFGR)
              IF(IPNT.NE.1)RETURN
              DO 12 I=1,NTOT
12            POIDS(I)=1.
              I=IASK(0,'FONCTION DE POIDS O/N $?')
              IF(I.NE.1)GO TO 9
              CALL FICSOR('POIDS$',NFP,SFP,IFMT)
              CALL LECTUR(NFP,SFP,IFMT,NS2,POIDS)
              CALL FERMSF(NFP,SFP)
              IPOIS=INTGET(0,'PUISSANCE DU POIDS ?$')
              IPOIS=IPOIS-1
              IF(IPOIS.EQ.0)GO TO 9
              DO 13 I=1,NTOT
              DO 13 I=1,IPOIS
13            POIDS(I)=POIDS(I)*POIDS(I)
9             CALL LECTUR(NFG,SFGR,IFMT,NS2,XRG)
              IF(SFGI.EQ.0.)GO TO 6
              CALL LECTUR(NFG,SFGI,IFMT,NS2,XIG)
              GO TO 8
6             DO 7 I=1,NTOT
7             XIG(I)=0.
8             XNMGG=0.
              DO 4 I=1,NTOT
4             CALL CALERR(XRG(I),XIG(I),POIDS(I),XNMGG,I,N)
              RETURN
              END $BATCH
$ASSM
**RIFFFT
RIFFFT    PROG
$FORT
          SUBROUTINE RIFFFT(XRG,XIG,POIDS,F,F1,WR,WI,XRF,XIF,NTFIX,IFMT,NP)
          DIMENSION XRG(1),XIG(1),F(1)
          DIMENSION NTFIX(9),IFMT(4),F1(1)
          DOUBLE PRECISION XRF(1),XIF(1),WR(1),WI(1)
          N=IFMT(1)
          NS2=N/2+1
          NML=NP/2
          NML1=NML+1
          DO 1 I=1,NS2
          DO 1 J=1,N
          INDXF=(I-1)*N+J
          XRF(INDXF)=0.
          XIF(INDXF)=0.
          IORIG=NML*NP+NML
          DO 2 K=1,NML1
          DO 2 L=1,NML1
          INDF=IORIG+(K-1)*NP+L
```

```
              INDI=K-1
              INDJ=L-1
              CALL CALIND(INDI,INDJ,I,J,N)
    2         CALL CALFOU(XRF,XIF,F,WR,WI,INDI,INDJ,INDXF,INDF)
              IORIG=IORIG+1
              DO 3 K=1,NML1
              DO 3 L=1,NML
              INDF=IORIG+(K-1)*NP-L
              INDI=K-1
              INDJ=N-L
              CALL CALIND(INDI,INDJ,I,J,N)
    3         CALL CALFOU(XRF,XIF,F,WR,WI,INDI,INDJ,INDXF,INDF)
              IORIG=NML*NP-NML1
              DO 4 K=1,NML
              DO 4 L=1,NML1
              INDF=IORIG-(K-1)*NP+L
              INDI=N-K
              INDJ=L-1
              CALL CALIND(INDI,INDJ,I,J,N)
    4         CALL CALFOU(XRF,XIF,F,WR,WI,INDI,INDJ,INDXF,INDF)
              IORIG=IORIG+1
              DO 1 K=1,NML
              DO 1 L=1,NML
              INDF=IORIG-(K-1)*NP-L
              INDI=N-K
              INDJ=N-L
              CALL CALIND(INDI,INDJ,I,J,N)
    1         CALL CALFOU(XRF,XIF,F,WR,WI,INDI,INDJ,INDXF,INDF)
              RETURN
              END $ASSM
**CALFOU
CALFOU    PROG
$FORT
              SUBROUTINE CALFOU(XRF,XIF,F,WR,WI,INDI,INDJ,INDXF,INDF)
              DIMENSION F(1)
              DOUBLE PRECISION XRF(1),XIF(1),WR(1),WI(1)
              DOUBLE PRECISION XWR,XWI
              XWR=WR(INDI)*WR(INDJ)-WI(INDI)*WI(INDJ)
              XWI=-WR(INDI)*WI(INDJ)-WI(INDI)*WR(INDJ)
              XRF(INDXF)=XRF(INDXF)+F(INDF)*XWR
              XIF(INDXF)=XIF(INDXF)+F(INDF)*XWI
              RETURN
              END $ASSM
**CALIND
CALIND    PROG
$FORT
              SUBROUTINE CALIND(INDI,INDJ,I,J,N)
              NUM=(I-1)*INDI
              NQUOT=NUM/N
              INDI=NUM-N*NQUOT+1
              NUM=(J-1)*INDJ
              NQUOT=NUM/N
              INDJ=NUM-N*NQUOT+1
              RETURN
              END
```

```
$BEND
$ASSM
**RIFDLT
RIFDLT    PROG
$FORT
      SUBROUTINE RIFDLT(XRG,XIG,POIDS,F,F1,WR,WI,XRF,XIF,PSI,XLAMBD,
     1GRAD,SL,SL1,NTFIX,IFMT,NP,NQ,ERRO)
      DIMENSION XRG(1),XIG(1),POIDS(1),F(1),F1(1),IFMT(4)
      DOUBLE PRECISION XRF(1),XIF(1),PSI(1),SL(1),SL1(1)
      DOUBLE PRECISION RNORM
      NQQ=NQ*NQ
      NQ1=NQ+1
      NQ2=NQ1+NQ
      NQ3=(NQ*(NQ+1))/2
      CALL CALPSI(XRF,XIF,POIDS,SL,NQ,IFMT(1),SL1)
      CALL RGPSI(PSI,SL,NQ)
      XMAX=0.
      IO=0
      DO 3 I=1,NQ
      IO=IO+I-1
      DO 3 J=1,I
      INDP=IO+J
      AUX=SL(INDP)
      IF(ABS(AUX).GT.XMAX) XMAX=ABS(AUX)
3     CONTINUE
      XNORM=0.
      DO 2 I=1,NQQ
2     XNORM=XNORM+PSI(I)*PSI(I)
      XNORM=SQRT(XNORM)
      XNORM=(XNORM+XMAX)/2.
      TAU=1.E-10*XNORM
      RNORM=XNORM
      CALL CALLBD(XRF,XIF,POIDS,XRG,XIG,NQ,IFMT(1),XLAMBD)
      CALL HFTI(PSI,NQ,NQ,XLAMBD,1,TAU,KRANK,RNORM,SL(1),SL(NQ1)
     1,SL(NQ2))
      CALL CALDLT(XRF,XIF,POIDS,XRG,XIG,XLAMBD,NQ,IFMT(1),ERRO)
      RETURN
      END $BATCH
$ASSM
**RIFGRD
RIFGRD    PROG
$FORT
      SUBROUTINE RIFGRD(XRG,XIG,POIDS,F,F1,WR,WI,XRF,XIF,PSI
     1,XLAMBD,GRAD,SL,SL1,NTFIX,IFMT,NP,XNMGD)
      DIMENSION IFMT(4)
      DOUBLE PRECISION XRF(1),XIF(1),WR(1),WI(1),GRAD(1)
      DOUBLE PRECISION XWR,XWI
      N=IFMT(1)
      N2=N*N
      NS2=N/2
      NML=NS2*N
      NP2=NP/2
      NP21=NP2+1
      NPLACE=NML+NS2+1
      NS21=NS2+1
      NPP=NP*NP
      DO 3 I=1,NP
      IF(I.GT.NP21) GO TO 30
      IC=I
      IQ=((I-1)+NP2)*NP
```

```
            GO TO 31
30      IC=N-NP+I
        IQ=((I-1)-NP21)*NP
31      NMLI=NS2*(IC-1)
        NUM=NMLI/N
        INDWI=NMLI-NUM*N+1
        DO 3 J=1,NP
        IF (J.GT.NP21) GO TO 40
        JC=J
        JQ=J+NP2
        GO TO 41
40      JC=N-NP+J
        JQ=J-NP21
41      NMLJ=NS2*(JC-1)
        NUM=NMLJ/N
        INDWJ=NMLJ-NUM*N+1
        INDG=IQ+JQ
        GRAD(INDG)=XRF(1)+XRF(NML+1)*WR(INDWI)+XRF(NS2+1)*WR(INDWJ)
        GRAD(INDG)=GRAD(INDG)-XIF(NML+1)*WI(INDWI)-XIF(NS21)*WI(INDWJ)
        GRAD(INDG)=GRAD(INDG)/N2
        XWR=WR(INDWI)*WR(INDWJ)-WI(INDWI)*WI(INDWJ)
        XWI=WR(INDWI)*WI(INDWJ)+WI(INDWI)*WR(INDWJ)
        GRAD(INDG)=GRAD(INDG)+(-XIF(NPLACE)*XWI+XRF(NPLACE)*XWR)/N2
        DO 2 L=2,NS2
        CALL DOGRAD(XRF,XIF,L,GRAD,INDG,IC,JC,1,L,N,WR,WI)
        INDF=NML+L
2       CALL DOGRAD(XRF,XIF,INDF,GRAD,INDG,IC,JC,NS21,L,N,WR,WI)
        DO 3 K=2,NS2
        DO 3 L=1,N
        INDF=(K-1)*N+L
3       CALL DOGRAD(XRF,XIF,INDF,GRAD,INDG,IC,JC,K,L,N,WR,WI)
        CALL OUTSTR(0,'GRADIENT$')
        DO 10 I=1,NP
        IWD=(I-1)*NP+1
        IWF=I*NP
10      WRITE(3,100) (GRAD(IG),IG=IWD,IWF)
        XNMGD=0.
        DO 11 I=1,NPP
11      XNMGD=XNMGD+GRAD(I)*GRAD(I)
        RETURN
100     FORMAT(1H ,/,5D15.5)
        END $ASSM
**DOGRAD
DOGRAD  PROG
$FORT
        SUBROUTINE DOGRAD(XRF,XIF,INDF,GRAD,INDG,I,J,K,L,N,WR,WI)
        DOUBLE PRECISION XRF(1),XIF(1),GRAD(1),WR(1),WI(1)
        DOUBLE PRECISION AUXR,AUXI
        N2=N*N
        NUM=((I-1)*(K-1))/N
        INDWI=((I-1)*(K-1))-NUM*N+1
        NUM=((J-1)*(L-1))/N
        INDWJ=((J-1)*(L-1))-NUM*N+1
        AUXR=WR(INDWI)*WR(INDWJ)-WI(INDWI)*WI(INDWJ)
        AUXI=WR(INDWI)*WI(INDWJ)+WI(INDWI)*WR(INDWJ)
        GRAD(INDG)=GRAD(INDG)+2.*(XRF(INDF)*AUXR-XIF(INDF)*AUXI)/N2
        RETURN
        END
```

```
$BEND
$BATCH
$ASSM
**CALNF
CALNF     PROG
$FORT
          SUBROUTINE CALNF(IFMT,NP,NQ,RHO,ERR1,XNMGG,IZP,IQS,NTF)
          DIMENSION NTF(14),IFMT(4)
          EXTERNAL RIFNF,RIFNFZ,RIFNFQ
          IF(IZP.EQ.2)GO TO 1
          IF(IQS.EQ.1)GO TO 2
          CALL EXEC(IER,14,NTF,0,0,RIFNFZ,IFMT,NP,NQ,RHO,ERR1,XNMGG)
          RETURN
2         CALL EXEC(IER,14,NTF,0,0,RIFNFQ,IFMT,NP,NQ,RHO,ERR1,XNMGG)
          RETURN
1         CALL EXEC(IER,14,NTF,0,0,RIFNF,IFMT,NP,NQ,RHO,ERR1,XNMGG)
          RETURN
          END $ASSM
**CALFPR
CALFPR    PROG
$FORT
          SUBROUTINE CALFPR(IFMT,NP,RHO,IZP,IQS,NTF)
          DIMENSION IFMT(4),NTF(14)
          EXTERNAL RIFFPR,RIFFPZ,RIFFPQ
          IF(IZP.EQ.2)GO TO 1
          IF(IQS.EQ.1)GO TO 2
          CALL EXEC(IER,14,NTF,0,0,RIFFPZ,IFMT,NP,RHO)
          RETURN
2         CALL EXEC(IER,14,NTF,0,0,RIFFPQ,IFMT,NP,RHO)
          RETURN
1         CALL EXEC(IER,14,NTF,0,0,RIFFPR,IFMT,NP,RHO)
          RETURN
          END $ASSM
**RIFNF
RIFNF     PROG
$FORT
          SUBROUTINE RIFNF(XRG,XIG,POIDS,F,F1,WR,WI,XRF,XIF,PSI,XLAMBD,
         1GRAD,SL,SL1,NTFIX,IFMT,NP,NQ,RHO,ERRO,XNMGG)
          DIMENSION F(1),F1(1)
          DOUBLE PRECISION GRAD(1),XLAMBD(1)
          CALL OUTSTR(0,"NOUVEAUX F$")
          XNORM=0.
          DO 2 I=1,NP
          DO 2 J=1,NP
          INDF=(I-1)*NP+J
          F(INDF)=F1(INDF)-RHO*GRAD(INDF)
2         XNORM=XNORM+ABS(F(INDF))
          DO 1 I=1,NP
          DO 11 J=1,NP
          IND=(I-1)*NP+J
          F(IND)=F(IND)/XNORM
11        F1(IND)=F(IND)
          IWDEB=(I-1)*NP+1
          IWFIN=I*NP
          WRITE(3,100)(F(IW),IW=IWDEB,IWFIN)
100       FORMAT(1H ,/,5E15.5,)
1         CONTINUE
          CALL OUTSTR(0,"LAMBDAS$")
          WRITE(3,102)(XLAMBD(IX),IX=1,NQ)
```

```
102     FORMAT(1H ,/,5D15.5)
        ERR=SQRT(ERRO/XNMGG)
        WRITE(3,101)ERR
101     FORMAT(1H ,'ERREUR QUADRATIQUE =',E15.5)
        RETURN
        END $ASSM
**RIFNFZ
RIFNFZ    PROG
$FORT
        SUBROUTINE RIFNFZ(XRG,XIG,POIDS,F,F1,WR,WI,XRF,XIF,PSI,XLAMBD,
       1GRAD,SL,SL1,NTFIX,IFMT,NP,NQ,RHO,ERRO,XNMGG)
        DIMENSION F(1),F1(1)
        DOUBLE PRECISION GRAD(1),XLAMBD(1)
        NPP=NP*NP
        CALL OUTSTR(0,'NOUVEAUX F$')
        DO 2 I=1,NPP
2       F(I)=F1(I)-RHO*GRAD(I)
        DO 12 I=1,NP
        DO 12 J=1,I
        IND1=(I-1)*NP+J
        IND2=(NP-I)*NP+NP-J+1
        F(IND1)=(F(IND1)+F(IND2))/2.
12      F(IND2)=F(IND1)
        XNORM=0.
        DO 13 I=1,NPP
13      XNORM=XNORM+ABS(F(I))
        DO 1 I=1,NP
        DO 11 J=1,NP
        IND=(I-1)*NP+J
        F(IND)=F(IND)/XNORM
11      F1(IND)=F(IND)
        IWDEB=(I-1)*NP+1
        IWFIN=I*NP
        WRITE(3,100)(F(IW),IW=IWDEB,IWFIN)
100     FORMAT(1H ,/,5E15.5,)
1       CONTINUE
        CALL OUTSTR(0,'LAMBDAS$')
        WRITE(3,102)(XLAMBD(IX),IX=1,NQ)
102     FORMAT(1H ,/,5D15.5)
        ERR=SQRT(ERRO/XNMGG)
        WRITE(3,101)ERR
101     FORMAT(1H ,'ERREUR QUADRATIQUE =',E15.5)
        RETURN
        END $ASSM
**RIFNFQ
RIFNFQ    PROG
$FORT
        SUBROUTINE RIFNFQ(XRG,XIG,POIDS,F,F1,WR,WI,XRF,XIF,PSI,XLAMBD,
       1GRAD,SL,SL1,NTFIX,IFMT,NP,NQ,RHO,ERRO,XNMGG)
        DIMENSION F(1),F1(1)
        DOUBLE PRECISION GRAD(1),XLAMBD(1)
        NPP=NP*NP
        NP2=NP/2+1
        CALL OUTSTR(0,'NOUVEAUX F$')
        DO 2 I=1,NPP
2       F(I)=F1(I)-RHO*GRAD(I)
        DO 12 I=1,NP
        DO 12 J=1,I
```

```
              IND1=(I-1)*NP+J
              IND2=(NP-I)*NP+NP-J+1
              F(IND1)=(F(IND1)+F(IND2))/2.
12            F(IND2)=F(IND1)
              DO 14 I=1,NP
              DO 14 J=1,NP2
              IND1=(I-1)*NP+J
              IND2=(I-1)*NP+NP-J+1
              F(IND1)=(F(IND1)+F(IND2))/2.
14            F(IND2)=F(IND1)
              XNORM=0.
              DO 13 I=1,NPP
13            XNORM=XNORM+ABS(F(I))
              DO 1 I=1,NP
              DO 11 J=1,NP
              IND=(I-1)*NP+J
              F(IND)=F(IND)/XNORM
11            F1(IND)=F(IND)
              IWDEB=(I-1)*NP+1
              IWFIN=I*NP
              WRITE(3,100) (F(IW),IW=IWDEB,IWFIN)
100           FORMAT(1H ,/,5E15.5,)
1             CONTINUE
              CALL OUTSTR(0,'LAMBDAS$')
              WRITE(3,102) (XLAMBD(IX),IX=1,NQ)
102           FORMAT(1H ,/,5D15.5)
              ERR=SQRT(ERRO/XNMGG)
              WRITE(3,101) ERR
101           FORMAT(1H ,'ERREUR QUADRATIQUE =',E15.5)
              RETURN

END $ASSM
**RIFFPR
RIFFPR    PROG
$FORT
              SUBROUTINE RIFFPR(XRG,XIG,POIDS,F,F1,WR,WI,XRF,XIF,PSI,XLAMBD
             1,GRAD,SL,SL1,NTFIX,IFMT,NP,RHO)
              DIMENSION F(1),F1(1)
              DOUBLE PRECISION GRAD(1)
              XNORM=0.
              DO 2 I=1,NP
              DO 2 J=1,NP
              INDF=(I-1)*NP+J
              F(INDF)=F1(INDF)-RHO*GRAD(INDF)
2             XNORM=XNORM+ABS(F(INDF))
              NPP=NP*NP
              DO 1 I=1,NPP
1             F(I)=F(I)/XNORM
              RETURN
              END $ASSM
**RIFFPZ
RIFFPZ    PROG
$FORT
              SUBROUTINE RIFFPZ(XRG,XIG,POIDS,F,F1,WR,WI,XRF,XIF,PSI,XLAMBD
             1,GRAD,SL,SL1,NTFIX,IFMT,NP,RHO)
              DIMENSION F(1),F1(1)
              DOUBLE PRECISION GRAD(1)
              NPP=NP*NP
```

```
        DO 2 I=1,NPP
2       F(I)=F1(I)-RHO*GRAD(I)
        DO 4 I=1,NP
        DO 4 J=1,I
        IND1=(I-1)*NP+J
        IND2=(NP-I)*NP+NP-J+1
        F(IND1)=(F(IND1)+F(IND2))/2.
4       F(IND2)=F(IND1)
        XNORM=0.
        DO 5 I=1,NPP
5       XNORM=XNORM+ABS(F(I))
        DO 1 I=1,NPP
1       F(I)=F(I)/XNORM
        RETURN
        END $ASSM
**RIFFFQ
RIFFFQ   PROG
$FORT
        SUBROUTINE RIFFFQ(XRG,XIG,POIDS,F,F1,WR,WI,XRF,XIF,PSI,XLAMBD
       1,GRAD,SL,SL1,NTFIX,IFMT,NP,RHO)
        DIMENSION F(1),F1(1)
        DOUBLE PRECISION GRAD(1)
        NPP=NP*NP
        NP2=NP/2
        DO 2 I=1,NPP
2       F(I)=F1(I)-RHO*GRAD(I)
        DO 4 I=1,NP
        DO 4 J=1,I
        IND1=(I-1)*NP+J
        IND2=(NP-I)*NP+NP-J+1
        F(IND1)=(F(IND1)+F(IND2))/2.
4       F(IND2)=F(IND1)
        DO 6 I=1,NP
        DO 6 J=1,NP2
        IND1=(I-1)*NP+J
        IND2=(I-1)*NP+NP-J+1
        F(IND1)=(F(IND1)+F(IND2))/2.
6       F(IND2)=F(IND1)
        XNORM=0.
        DO 5 I=1,NPP
5       XNORM=XNORM+ABS(F(I))
        DO 1 I=1,NPP
1       F(I)=F(I)/XNORM
        RETURN
        END $BEND
```

We claim:

1. A method of convolving a data array comprising the steps of scanning said data array with a mask selected according to a predetermined criteria, replacing said data array with the output of said scan as a new data array, rescanning and replacing said new data array with a different mask selected according to said predetermined criteria a predetermined number of times, and extracting the new data array as an output data array after completion of the predetermined number of scans.

2. The method of claim 1 further comprising the step of repeating said scanning, replacing and rescanning steps for each of a plurality of arrays representing images of different spectral characteristics.

3. The method of claim 1 further comprising the step of repeating said scanning, replacing and rescanning steps for each of a plurality of color images.

4. A method of convolving a data array comprising the steps of scanning said data array with a mask selected according to a predetermined criteria, weighting the output of said scan according to said predetermined criteria, replacing said data array with the output of said weighting step as a new data array, and repeating said scanning, weighting and replacing steps a predetermined number of times to provide a filtered array as an output.

5. The method of claim 4 wherein said repeating step includes repeating each of said remaining steps for each of a plurality of arrays representing images of different spectral characteristics.

6. A method of convolving a data array with a two dimensional filter comprising the steps of scanning said data array with a mask selected according to a predetermined criteria, weighting the output of said scan according to said predetermined criteria, summing said weighted output with the weighted output of all previous scans, replacing said data array with successive scanned and weighted outputs, and repeating said scanning, weighting, summing, and replacing steps a predetermined number of times, said mask and said weighting being varied for each successive scan in accordance with said predetermined criteria.

7. The method of claims 1, 4 or 6 wherein the step of scanning said data array includes the step of determining mask weights to minimize error between an exact, large size convolution operator and an operator synthesized by repeated convolution with small generating kernal operators.

8. The method of claims 4 or 6 further including the steps of selecting mask weights for the mask and output weighting factors according to a criteria designed to minimize error between an exact, large size convolution operator and an operator synthesized by repeated convolution with small generating kernal operators.

9. The method of claim 6 wherein said repeating step includes repeating each of said remaining steps for each of a plurality of color images.

10. Apparatus for convolving a digital data array comprising data input means for receiving said data array, mask means having a mask array for scanning said data array and providing a convolution of said mask array and said data array, feedback means for providing said convolution to said data input means, and output means for receiving the convolution of said mask array and said data array from said mask means.

11. Apparatus for convolving a digital data array comprising memory means having an input for receiving said data array and an output, mask means having a mask array and connected to said output of said memory means for providing a convolution of said mask array and said data array, weighting means having an output for weighting said convolution in accordance with a predetermined criteria, feedback means for providing the output of said weighting means to the input of said memory means, and output means responsive to said weighting means for providing an output data array.

12. The apparatus of claims 10 or 11 further including sequencing means for supplying said mask array to said mask means and to control said feedback means.

13. A method of convolving a data array comprising the steps of selecting a mask with mask weights assigned according to a predetermined criteria to minimize error between an exact large size convolution operator and an operator synthesized by repeated convolution with small generating kernel operators, scanning said data array with the mask selected according to the predetermined criteria, replacing said data array with the output of said scan as a new data array, and rescanning and replacing said data array with a different mask selected according to said predetermined criteria a predetermined number of times.

* * * * *